(12) United States Patent
Renzas et al.

(10) Patent No.: US 11,276,727 B1
(45) Date of Patent: Mar. 15, 2022

(54) SUPERCONDUCTING VIAS FOR ROUTING ELECTRICAL SIGNALS THROUGH SUBSTRATES AND THEIR METHODS OF MANUFACTURE

(71) Applicant: Rigetti & Co, LLC, Berkeley, CA (US)

(72) Inventors: James Russell Renzas, San Mateo, CA (US); Jayss Daniel Marshall, Fair Oaks, CA (US); Cat-Vu Huu Bui, Fremont, CA (US); Mehrnoosh Vahidpour, El Cerrito, CA (US); William Austin O'Brien, IV, Sylmar, CA (US); Andrew Joseph Bestwick, Berkeley, CA (US); Chad Tyler Rigetti, Emeryville, CA (US); Keith Matthew Jackson, Berkeley, CA (US)

(73) Assignee: Rigetti & Co, LLC, Berkeley, CA (US)

( * ) Notice: Subject to any disclaimer, the term of this patent is extended or adjusted under 35 U.S.C. 154(b) by 86 days.

(21) Appl. No.: 16/012,262

(22) Filed: Jun. 19, 2018

Related U.S. Application Data

(60) Provisional application No. 62/521,781, filed on Jun. 19, 2017.

(51) Int. Cl.
*H01L 27/18* (2006.01)
*H01L 23/538* (2006.01)
(Continued)

(52) U.S. Cl.
CPC ............. *H01L 27/18* (2013.01); *G06N 10/00* (2019.01); *H01L 23/5383* (2013.01);
(Continued)

(58) Field of Classification Search
CPC ... H01L 27/18; H01L 39/223; H01L 23/5383; H01L 23/552; G06N 10/00; H05K 1/115
See application file for complete search history.

(56) References Cited

U.S. PATENT DOCUMENTS 3,343,256 A 9/1967 Smith et al.
3,863,181 A 1/1975 Glance et al.
(Continued)

FOREIGN PATENT DOCUMENTS

WO 2014092819 6/2014
WO 2014163728 10/2014
(Continued)

OTHER PUBLICATIONS

Gupta, et al., "Minimizing Film Stress and Degradation in Thin-film Nb Superconducting Cables", MAPS 13th Internaitonal Conference and Exhibition on Device Packaging, Mar. 2017, 4 pgs.
(Continued)

*Primary Examiner* — Thanh T Nguyen
(74) *Attorney, Agent, or Firm* — Henry Patent Law Firm PLLC

(57) ABSTRACT

In a general aspect, a superconducting via for routing electrical signals through a substrate includes the substrate and a layer formed of superconducting material. The substrate has a first orifice disposed on a first surface and a second orifice disposed on a second surface. A cavity extends through the substrate from the first orifice to the second orifice. The layer of superconducting material includes a first portion occluding the first orifice and having an exterior surface facing outward from the substrate. The layer also includes a second portion in contact with a side wall of the cavity and extending to the second orifice. A quantum circuit element may optionally be disposed on the first surface and electrically coupled to the exterior surface of the first portion of the layer.

19 Claims, 11 Drawing Sheets

(51) Int. Cl.
  *H05K 1/11* (2006.01)
  *H01L 39/22* (2006.01)
  *H01L 23/552* (2006.01)
  *G06N 10/00* (2022.01)

(52) U.S. Cl.
  CPC .......... *H01L 23/552* (2013.01); *H01L 39/223* (2013.01); *H05K 1/115* (2013.01)

(56) References Cited

U.S. PATENT DOCUMENTS

| | | | |
|---|---|---|---|
| 5,501,893 | A | 3/1996 | Laermer et al. |
| 5,700,715 | A | 12/1997 | Pasch |
| 5,796,714 | A | 8/1998 | Chino et al. |
| 5,814,889 | A | 9/1998 | Gaul |
| 5,929,728 | A | 7/1999 | Barnett et al. |
| 5,990,768 | A | 11/1999 | Takahashi |
| 6,130,483 | A | 10/2000 | Shizuki et al. |
| 6,284,148 | B1 | 9/2001 | Laermer et al. |
| 6,434,312 | B1 | 8/2002 | Knighten |
| 6,531,068 | B2 | 3/2003 | Laermer et al. |
| 6,979,836 | B2 | 12/2005 | Zagoskin et al. |
| 7,218,184 | B2 | 5/2007 | Yamanaka et al. |
| 7,554,193 | B2 | 6/2009 | Osone et al. |
| 7,928,375 | B1 | 4/2011 | Mangan et al. |
| 7,932,515 | B2 | 4/2011 | Bunyk |
| 8,003,410 | B2 | 8/2011 | Kerner et al. |
| 8,030,208 | B2 | 10/2011 | Leung et al. |
| 8,125,058 | B2 | 2/2012 | Mueller et al. |
| 8,169,059 | B2 | 5/2012 | Barth et al. |
| 8,518,823 | B2 | 8/2013 | Huang et al. |
| 8,642,998 | B2 | 2/2014 | Gambetta et al. |
| 8,796,140 | B1 | 8/2014 | Gu et al. |
| 8,916,471 | B1 | 12/2014 | Yang et al. |
| 9,035,457 | B2 | 5/2015 | Lin et al. |
| 9,287,228 | B2 | 3/2016 | Kraus et al. |
| 9,397,283 | B2 | 7/2016 | Abraham et al. |
| 9,422,156 | B2 | 8/2016 | Smeys |
| 9,437,561 | B2 | 9/2016 | Black et al. |
| 9,455,391 | B1* | 9/2016 | Nayfeh ............... H01L 39/2493 |
| 9,508,680 | B1 | 11/2016 | Ayotte et al. |
| 9,520,547 | B2 | 12/2016 | Abraham et al. |
| 9,836,699 | B1 | 12/2017 | Rigetti et al. |
| 9,971,970 | B1 | 5/2018 | Rigetti et al. |
| 10,068,181 | B1 | 9/2018 | Rigetti et al. |
| 2003/0116417 | A1 | 6/2003 | Dereus |
| 2004/0000666 | A1 | 1/2004 | Lidar |
| 2004/0173891 | A1 | 9/2004 | Imai et al. |
| 2004/0222478 | A1 | 11/2004 | Zhang et al. |
| 2005/0057327 | A1 | 3/2005 | Kwon et al. |
| 2005/0077627 | A1* | 4/2005 | Yu ..................... H01L 21/76846 257/751 |
| 2005/0195051 | A1 | 9/2005 | McKinzie, III |
| 2006/0081396 | A1 | 4/2006 | Hsu |
| 2006/0092079 | A1 | 5/2006 | de Rochemont |
| 2006/0170556 | A1 | 8/2006 | Fang |
| 2006/0255876 | A1 | 11/2006 | Kushta et al. |
| 2007/0017693 | A1 | 1/2007 | Bois et al. |
| 2007/0152771 | A1 | 7/2007 | Shan et al. |
| 2008/0159679 | A1 | 7/2008 | Sigalas et al. |
| 2009/0057848 | A1 | 3/2009 | Johnson |
| 2009/0080172 | A1 | 3/2009 | Arslan et al. |
| 2009/0099025 | A1 | 4/2009 | Uchaykin |
| 2010/0045536 | A1 | 2/2010 | Fukui et al. |
| 2010/0134370 | A1 | 6/2010 | Oh et al. |
| 2010/0142259 | A1 | 6/2010 | Drndic |
| 2010/0201003 | A1 | 8/2010 | Thompson et al. |
| 2010/0225436 | A1 | 9/2010 | Papavasiliou et al. |
| 2010/0308941 | A1 | 12/2010 | Fujii et al. |
| 2011/0032048 | A1 | 2/2011 | Wu et al. |
| 2011/0065585 | A1 | 3/2011 | Lanting et al. |
| 2011/0089405 | A1 | 4/2011 | Ladizinsky et al. |
| 2011/0148441 | A1 | 6/2011 | Yamamoto et al. |
| 2011/0175061 | A1 | 7/2011 | Berkley et al. |
| 2012/0146881 | A1 | 6/2012 | Mckinzie, III |
| 2012/0325544 | A1 | 12/2012 | Toyao et al. |
| 2013/0057362 | A1 | 3/2013 | Wu et al. |
| 2013/0082890 | A1 | 4/2013 | Wang et al. |
| 2013/0087766 | A1 | 4/2013 | Schenkel et al. |
| 2013/0196855 | A1 | 8/2013 | Poletto et al. |
| 2013/0246990 | A1 | 9/2013 | Yen et al. |
| 2013/0293323 | A1 | 11/2013 | Nakase |
| 2013/0306363 | A1 | 11/2013 | Yukimasa |
| 2014/0167836 | A1 | 6/2014 | Gambetta et al. |
| 2014/0254307 | A1 | 9/2014 | Zhao et al. |
| 2014/0264286 | A1 | 9/2014 | Chang et al. |
| 2014/0264287 | A1 | 9/2014 | Abraham et al. |
| 2014/0274725 | A1 | 9/2014 | Abraham et al. |
| 2014/0314419 | A1 | 10/2014 | Paik |
| 2015/0179913 | A1 | 6/2015 | Pramanik et al. |
| 2015/0214631 | A1 | 7/2015 | Yukimasa |
| 2015/0270622 | A1 | 9/2015 | Takasaki et al. |
| 2015/0037221 | A1 | 12/2015 | Schoelkopf, III et al. |
| 2015/0357550 | A1 | 12/2015 | Schoelkopf, III et al. |
| 2015/0371938 | A1* | 12/2015 | Katkar ................ H01L 25/50 257/774 |
| 2015/0372217 | A1 | 12/2015 | Schoelkopf, III et al. |
| 2016/0125311 | A1 | 5/2016 | Fuechsle et al. |
| 2016/0149900 | A1 | 5/2016 | Justin et al. |
| 2016/0157338 | A1 | 6/2016 | Toyota et al. |
| 2016/0267032 | A1 | 9/2016 | Rigetti et al. |
| 2016/0292586 | A1 | 10/2016 | Rigetti et al. |
| 2016/0292587 | A1 | 10/2016 | Rigetti et al. |
| 2016/0314231 | A1 | 10/2016 | Tsang et al. |
| 2016/0345623 | A1 | 11/2016 | Ishiwata et al. |
| 2016/0364653 | A1 | 12/2016 | Chow et al. |
| 2017/0133336 | A1 | 5/2017 | Oliver et al. |
| 2018/0005887 | A1* | 1/2018 | Abraham .......... H01L 21/76898 |
| 2018/0012932 | A1 | 1/2018 | Oliver et al. |
| 2018/0102470 | A1* | 4/2018 | Das ..................... H01L 23/5384 |

FOREIGN PATENT DOCUMENTS

| | | |
|---|---|---|
| WO | 2015178990 A2 | 11/2015 |
| WO | 2015178991 A2 | 11/2015 |
| WO | 2015178992 A2 | 11/2015 |

OTHER PUBLICATIONS

Specialty Coating Systems, "Electronics", accessed online at https://scscoatings.com/parylene-applications/electronic-coatings, copyright 2017, 4 pgs.
"Wikipedia, Deep Reactive-Ion Etching", Apr. 23, 2018, 4 pgs.
Booi, et al., "Intrinsic Stress in dc Sputtered Nobium", IEEE Transactions on Applied Superconductivity, vol. 3, No. 2, Jun. 1993, 3 pgs.
Brecht, T., et al., "Multilayer microwave integrated quantum circuits for scalable quantum computing", arXiv:1509.01127v1 [quant-ph], Sep. 3, 2015, 5 pages.
Bruno, et al., "Fabrication of Circuit QED Quantum Processors, Part 1: Extensible Footprint for a Superconducting Surface Code", Abstract, APS March Meeting, Mar. 13-17, 2017, 1 pg.
Bruno, A., et al., "Reducing intrinsic loss in superconducting resonators by surface treatment and deep etching of silicon substrates", arXiv:1502.04082v1 [cond-mat supr-con], Appl. Phys. Lett. 106, 182601, Feb. 13, 2015, 11 pages.
Cho, J., et al., "Through Silicon via (TSV) Shielding Structures", Prof. IEEE Conference on Electrical Performance of Electronic Packaging and Systems (EPEPS), Oct. 25, 2010, pp. 269-272.
Clariant AG, "AZ® 9200 Photoresist, High-Resolution Thick Resist, Product Data Sheet", dated Jul. 1997, 8 pages.
Copsey, et al., "Toward a Scalable, Silicon-Based Quantum Computing Architecture", IEEE Journal of Selected Topics in Quantum Electronics, vol. 9, No. 6,, Nov. 2003, 18 pages.
Custom Interconnects, "Thinnerposer® Board To Board Connector, Ultra Low Profile Interposer", online at http://custominterconnects.com/files/Thinnerposer_Product_Slick.pdf as of Jan. 8, 2016, 1 page.
Dixit, et al., "Effect of Process Gases on Fabricating Tapered Through-Silicon vias by Continuous SF2/O2/Ar Plasma Etching", ECS Journal of Solid State Science and Technology, 1 (3) 107, 2012, 10 pgs.

(56) References Cited

OTHER PUBLICATIONS

Figueroa, et al., "Control of sidewall slope in silicon vias using SF6/O2 plasma etching in a conventional reactive ion etching tool", Sep. 2005, 7 pgs.

Fowler, et al., "Surface Codes: Towards practical large-scale quantum computation", Phys. Rev. A 86, 032324, 2012, 54 pgs.

Gambino, Jeffrey P., et al., "An overview of through-silicon-via technology and manufacturing challenges", Microelectronic Engineering 135, Jan. 8, 2015, pp. 73-106.

Geerlings, Kurtis Lee, "Improving Coherence of Superconducting Qubits and Resonators", Dissertation—Yale University, Aug. 19, 2013, 256 pages.

Héraud, et al., "Easy to Fill Sloped Vias for Interconnects Applications Improved Control of Silicon Tapered Etch Profile", IEEE, Electronic Components and Technology Conference, 2009, 4 pgs.

Hong, et al., "Improvements in TiWN barrier technology for devices using Au metallisation", Microelectronic Engineering 64, 2002, 6 pgs.

Kahouli, et al., "Structural and dielectric study of parylene C thin films", Appl. Phys. Lett. 94, 152901, 2009, 5 pgs.

Kelly, et al., "3D integration of superconducting qubits with bump bonds: Part 2", APS Meeting, Mar. 2017, 1 pg.

Koch, Jens, et al., "Charge-insensitive qubit design derived from the Cooper pair box", Physical Review A 76, 042319, Oct. 12, 2007, 19 pages.

Lau, "Through-Silicon Vias for 3D Integration", 2013, 5 pgs.

Lucero, et al., "3D integration of superconducting qubits with bump bonds: Part 3", APS Meeting, Mar. 2017, 1 pg.

Marty, et al., "Advanced etching of silicon based on deep reactive ion etching for silicon high aspect ratio microstructures and three-dimensional micro- and nanostructures", Microelectronics Journal 36, 7, 2005, 5 pgs.

Megrant, Anthony, et al., "High Quality Factor MBE-grown Aluminum on Silicon Planar Resonators", APS March Meeting 2015, Nov. 14, 2014, 3 pages.

Micro Chem, "SU-8 2000 Permanent Epoxy Negative Photoresist", online at http://www.microchem.com/pdf/SU-82000DataSheet2100and2150Ver5.pdf as of Apr. 15, 2015, 5 pages.

Microwaves and RF, "What is LTCC?", http://mwrf.com/components/what-ltcc, Jun. 16, 2006, 2 pages.

Mohseni, et al., "Commercialize early quantum technologies", Nature 543, Mar. 9, 2017, 5 pgs.

Mutus, et al., "3D integration of superconducting qubits with bump bonds: Part 1", APS Meeting, Mar. 2017, 1 pg.

Nagarajan, et al., "Development of a novel deep silicon tapered via etch process for through-silicon interconnection in 3-D integrated systems", Electronic Components and Technology Conference, IEEE, May 30, 2006, 6 pgs.

Paik, Hanhee, et al., "Observation of High Coherence in Josephson Junction Qubits Measured in a Three-Dimensional Circuit QED Architecture", Physical Review Letters 107, 240501, Dec. 5, 2011, 5 pages.

Powell, O., et al., "Anisotropic etching of {100} and {110} planes in (110) silicon", J. Micromech. Microeng. 11, 2001, pp. 217-220.

Rigetti, Chad, et al., "Superconducting qubit in a waveguide cavity with a coherence time approaching 0.1 ms", Physical Review B 86, 100506(R), Sep. 24, 2012, 5 pages.

Rosenberg, et al., "3D integrated superconducting qubits", arXiv:1706.04116, version 1 dated Jun. 13, 2017, version 2 dated Jun. 19, 2017, 14 pgs.

Shipley, "Microposit S1800 Series Photo Resists", online at http://www.microchem.com/PDFs_Dow/S1800.pdf as of Apr. 15, 2016, 6 pages.

Wenner, J., et al., "Surface loss simulations of superconducting coplanar waveguide resonators", Applied Physics Letters 99, 113513, Sep. 15, 2011, 3 pages.

Wong, Alice, "Via Fill in Small Trenches Using Hot Alumnium Process", online at http://microlab.berkeley.edu/text/AliceWong.pdf as of Apr. 15, 2015, 34 pages.

Dunsworth, et al., "Characterization and Reduction of Capacitive Loss Induced by Sub-Micron Josephson Junction Fabrication in Superconducting Qubits", arXiv:1706.00879v1, Jun. 3, 2017, 9 pgs.

\* cited by examiner

SUPERCONDUCTING VIAS FOR ROUTING ELECTRICAL SIGNALS THROUGH SUBSTRATES AND THEIR METHODS OF MANUFACTURE

CROSS-REFERENCE TO RELATED APPLICATIONS

This application claims priority to U.S. Provisional Application Ser. No. 62/521,781 entitled "Microwave Integrated Quantum Circuits with Vias and Methods of Making the Same", filed Jun. 19, 2017. The disclosure of the priority application is hereby incorporated herein by reference.

BACKGROUND

The following description relates to vias, and more specifically, to superconducting vias for routing electrical signals through a substrate.

Quantum computers can perform computational tasks by using quantum circuit elements fabricated on a substrate. In some quantum computers, the quantum circuit elements exchange signals by receiving and sending electrical currents. These electrical currents may travel in-plane on a surface of the substrate. However, the computing industry seeks to develop quantum computers based on a three-dimensional packaging of substrates. As such, substrate features that allow superconducting electrical currents to travel out-of-plane through a substrate are desirable.

DETAILED DESCRIPTION

Figure 1A:
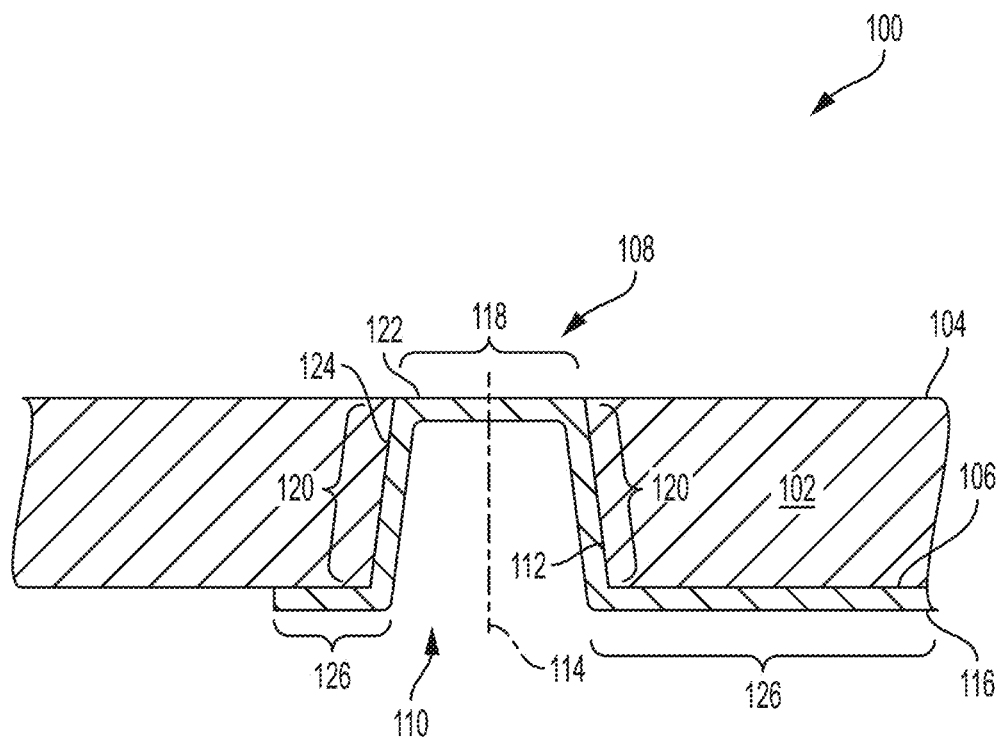
FIG. 1A is a schematic diagram, in cross-section, of an example superconducting via for routing electrical signals through a substrate.

Integrated circuits often require routing through a thickness of the substrate. Such routing may be achieved by through-silicon vias (TSVs) that are fabricated by first etching a hole or trench into a substrate and then depositing a very thin conductive liner (i.e., 0.1-10 nm thick). The conductive liner may be deposited by a physical deposition process, such as atomic layer deposition, plasma vapor deposition, chemical vapor deposition, and so forth. Copper is subsequently electroplated into the hole or trench to cover the conductive liner. A final polishing step may be used to remove any overburden extending outside of the hole or trench (e.g., chemical-mechanical polishing). Copper is necessary to reduce the trace resistance of a conventional through-silicon via to a suitable level, and circuits incorporating such vias are expected to survive temperatures between about −50° C. to +150° C. A stress-reduction layer (e.g., a layer of benzocyclobutene) may sometimes be included between the substrate and the conductive liner to minimize delamination and stress-cracking. Moreover, the conventional through-silicon via is often etched blind to a known depth in the substrate. The backside is later revealed through back-grinding processes prior to further metallization and processing.

Quantum integrated circuits can utilize through-silicon vias to establish conductive paths for electrical grounding and intra-circuit communication between circuit elements. The through-silicon vias can also disrupt troublesome electromagnetic modes that stem from substrate dimensions and associated packaging geometries. Moreover, the through-silicon vias can be used to provide electrical isolation between adjacent circuit elements, which is particularly beneficial for operation at microwave frequencies. The through-silicon vias can additionally be used to pass signals from one side of a substrate to another, thereby aiding the compatibility of quantum integrated circuits with various 3D packaging geometries, such as achieved through thermo-compression bump bonding. In this capacity, through-silicon vias allow signals to be routed off-substrate without using failure-prone structures such as airbridges or additive processes.

Conventional through-silicon vias utilize copper, which is not a superconducting material. As such, existing processes for fabricating conventional through-silicon vias are not suitable for manufacturing quantum integrated circuits that rely on superconductivity for the transmission of electrical signals. Simple drop-in replacement strategies for copper do not remedy this problem. For example, conventional through-silicon vias may also incorporate aluminum. However, although aluminum is a superconducting material below 1.1 K, the resulting aluminum stacks are not compatible with quantum integrated circuits. The aluminum stacks, which are typically fabricated through electroplating, are strongly prone to incorporating magnetic inclusions, which decohere quantum circuit elements. Moreover, aluminum offers poor chemical resistance to downstream fabrication processes and has a high coefficient of thermal expansion (CTE). Both of these characteristics impose limitations on the usefulness of aluminum in through-silicon vias fabrication processes.

In particular, a quantum through-silicon via (QTSV) must be robust to post-deposition chemical processing (e.g. oxide etches, solvent cleans, etc.) and must survive large temperature swings (e.g., up to 500° C.). Such temperature swings result not only from baking temperatures common to frontside processes (e.g., a lithography hard bake), but also from environments common to cryogenic dilution fridges (e.g., 10-100 mK). Temperature swings to cryogenic temperatures present particularly strong challenges to materials compatibility in quantum through-silicon vias, as differences in thermal-induced expansion (or contraction) may accrue concomitantly with a transition to brittle mechanical properties.

Furthermore, although additive processes are common in conventional integrated circuits, they are not appropriate for quantum integrated circuits because any dielectric material used therein may introduce radio-frequency losses into the quantum integrated circuit. Radio frequency losses are manageable in classical circuits at conventional signal levels, but may degrade a quantum integrated circuit to the point of inoperability. Quantum integrated circuits rely on small electrical signal levels, and as such, radio frequency losses may reduce the signal levels to the point of being undetectable.

Due to the limitations of conventional designs and manufacturing processes, vias for quantum integrated circuits have been a subject of study by those skilled in the art. For example, via fabrication processes have been developed using a conventional Bosch process to etch through a silicon substrate. Thereafter, CVD, ALD or similar processes can be used to line the resulting hole with various candidate superconducting nitrides, for example.

However, the via configuration described above (and its manufacturing method) is poorly compatible with downstream processes, especially those that subsequently fabricate the quantum circuit elements. The via configuration described above has a top and bottom open structure, which is essentially an unoccluded hole lined with superconductor material. This configuration is problematic for downstream processes because special care must be taken to ensure that thin photo- or electron-beam resists can be coated uniformly across the wafer. Moreover, although quantum circuits tend to be comprised primarily of larger circuit elements, post-processing substrates with multiple holes requires a dry resist or other thick resist to tent the holes (i.e., span over or cover the holes). This tenting negatively impacts the proper formation of the quantum circuit elements. Tenting resists may be used for patterning less-sensitive circuit elements.

A particularly critical element in a quantum circuit is the Josephson junction, one for which, the dimensions of the junction significantly influence the circuit's characteristics. Josephson junctions are a non-linear circuit element for quantum computing that relies on a superconducting state for operation. They physically correspond to a metal-insulator-metal (MIM) structure in which the insulating barrier between the metals has a prescribed area and thickness. The area and thickness cooperatively determine a Josephson energy of the Josephson junction—a key quantity in quantum circuit design. Conventional through-silicon vias, such as the open via structures described above, distort a resist's thickness for some distance around the via. This distortion is especially acute for thin resists such as those used in electron beam lithography, and in turn, introduces error and imprecision into the area and thickness of the Josephson junction. Fabricating quantum circuit elements initially, i.e., before the through-silicon vias are fabricated, does not mitigate this problem. Quantum circuit elements are extremely sensitive to downstream contamination, and as such, their fabrication after fabrication of the through-silicon vias is deeply desirable. Conventional through-silicon vias and their fabrication methods are thus not able to meet the increasing requirements of quantum circuitry. In particular, these vias are not compatible with cryogenic temperatures and cycling, fail to exhibit superconductivity, impede tight control of lithographic dimensions, and suffer from extreme sensitivity to contamination from downstream processing. New designs and manufacturing processes for quantum through-silicon vias are thus needed.

The embodiments described herein disclose superconducting vias for routing electrical signals through a substrate. The vias include the substrate and a layer formed of superconducting material. The substrate has a first orifice disposed on a first surface and a second orifice disposed on a second surface. A cavity extends through the substrate from the first orifice to the second orifice. The layer of superconducting material includes a first portion occluding the first orifice and having an exterior surface facing outward from the substrate. It will be appreciated that the first portion corresponds to a membrane structure that closes the otherwise open structure of the cavity and provides physical continuity across the first surface, which may be planar. As such, compatibility of vias to downstream processes is notably improved, especially in regard to fabricating quantum circuit elements on the first surface. The layer also includes a second portion in contact with a side wall of the cavity and extending to the second orifice. The second portion allows the via to provide an electrical pathway through the substrate (along with the first portion), which at or below a superconducting critical temperature, becomes a superconducting electrical pathway. A quantum circuit element may optionally be disposed on the first surface and electrically coupled to the exterior surface of the first portion of the layer. Methods for manufacturing the via are also described.

Now referring to FIG. 1A, a schematic diagram is presented, in cross-section, of an example via 100 for routing electrical signals through a substrate 102. The superconducting via 100 includes the substrate 102, which may be formed of any type of material suitable for supporting integrated electronic circuits, such as silicon, germanium, gallium arsenide, silicon dioxide, and aluminum oxide (i.e., sapphire). The substrate 102 may be a single-crystal substrate, a polycrystalline substrate, or an amorphous substrate. The substrate 102 includes a first surface 104 and a second surface 106, which in many implementations, are planar surfaces disposed opposite each other and parallel thereto. FIG. 1A depicts one such implementation. However, this depiction is not intended as limiting. Other types of surfaces and their relative orientations are possible (e.g., curved surfaces, textured surfaces, surfaces at angles to each other, etc.). In some instances, the substrate 102 has a thickness ranging from about 100 μm to 800 μm.

The substrate 102 includes a first orifice 108 disposed on the first surface 104 and a second orifice 110 disposed on the second surface 106. The first and second orifices 108, 110 may have any type of enclosed perimeter shape, e.g., a circle, a square, a hexagon, an oval, and so forth. In some implementations, such as shown in FIG. 1, the first and second orifices 108 have circular shapes. In these implementations, the first and second orifices 108 may have diameters from 40 μm to 200 μm. A cavity 112 extends from the first orifice 108 to the second orifice 110. The cavity 112 may extend along a longitudinal axis 114 perpendicular to the first and second surfaces 104, 106, such as depicted in FIG. 1. However, this depiction is for purposes of illustration only. The cavity 112 may be any shape capable of continuously connecting the first orifice 108 to the second orifice 110. For example, the cavity 112 may be shaped as a frustum having an aspect ratio of 10:1 or greater.

The via 100 includes a layer 116 of superconducting material having a first portion 118 and a second portion 120. As used herein, the term "superconducting material" refers to any material capable of entering a superconducting state at or below a superconducting critical temperature. Non-limiting examples of such materials include Hg, Pb, Nb, NbN, TiN, $Nb_3Sn$, $V_3Si$, $Nb_3Ti$, Ti—Nb, Nb—Ti—N alloys, Mo—Re alloys, La—Ba—Cu oxides, Y—Ba—Cu oxides, Bi—Sr—Ca—Cu oxides, Tl—Ba—Ca—Cu oxides, and Hg—Ba—Ca—Cu oxides. Other materials are possible, including composite structures of superconducting materials (e.g., a multi-layer stacks of superconducting materials). In some instances, the layer 116 of superconducting material has a thickness ranging from about 0.1 µm to 10 µm. For example, the layer 116 of superconducting material may be formed of titanium nitride and have a thickness of about 1 µm. In some instances, the layer 116 of superconducting material supports electrical currents of at least 100 µA. For example, the layer 116 of superconducting material may be formed of niobium, having a thickness of about 2 µm, and support an electrical current up to 30 mA.

The first portion 118 of the layer 116 occludes the first orifice 108 and has an exterior surface 122 facing outward from the substrate 102. The exterior surface 122 serves as a superconducting electrical pad for coupling the via 100 to a quantum circuit element disposed on the first surface 104. The exterior surface 122 may be planar (or nearly planar). It will be appreciated that the first portion 118 defines a membrane structure that spans the first orifice 108. In some implementations, the first portion 118 fully occludes the first orifice 108. In these implementations, the first portion 118 may prevent fluids (e.g., photoresist) from leaking through the cavity 112 during the fabrication of circuit features on the substrate 102. The first portion 118 may have a perimeter bounded by the first orifice 108 (e.g., a diameter of 97 µm). It will also be appreciated that the exterior surface 122 may lie in-plane with the first surface 104, above-plane of the first surface 104, or below-plane of the first surface 104. FIG. 1A depicts the exterior surface 122 as lying in-plane with the first surface 102. However, this depiction is not intended as limiting. In some implementations, the exterior surface 122 is no greater than 50 µm above-plane or below-plane of the first surface 104.

The second portion 120 of the layer 116 is in contact with a side wall 124 of the cavity and extends to the second orifice 110. In many implementations, such contact occurs along an entire surface of the side wall 124. The second portion 120 is configured to provide electrical continuity of the layer 116 from the first portion 118 (or first orifice 108) to at least the second orifice 110. In this capacity, the second portion 120 may provide a pathway for electrical signals to travel from the first surface 104 of the substrate 102 to the second surface 106. In some implementations, the layer 116 of superconducting material includes a third portion 126 covering an area of the second surface 106 and in contact therewith. The third portion 126 may correspond to a patterned portion of superconducting material and may assist in routing electrical signals off of the substrate (e.g., to other electrical circuitry).

In operation, a temperature of the via 100 is reduced to a magnitude at or below the superconducting critical temperature of the layer 116 (e.g., T≤10 mK). As a result, the superconducting material forming the layer 116 enters a superconducting state, allowing electrical currents (e.g., signals, ground currents, etc.) to pass through the layer 116 with no discernable Ohmic resistance. By traversing the layer 116 of superconducting material, the electrical currents also traverse the substrate 102. The layer 116 in particular receives and delivers electrical currents through the exterior surface 122, which may be electrically coupled to a quantum computing element. The layer 116 also receives and delivers electrical currents through a distal end of the second portion 120, or if present, an exterior surface of the third portion 126. The third portion 126 may be coupled to a solder bump or ball for electrical communication with one or more devices off-substrate. Alternatively, the third portion 126 may be coupled to another instance of the via 100 in the substrate 102 (i.e., the third portion 126 is shared in common between two vias). In this configuration, the third portion 126 may allow the exchange of electrical currents between two quantum circuit elements on the first surface 104, albeit along an electrical pathway that utilizes the second surface 106 in preference over the first surface 104.

The via 100 may improve signal delivery between quantum circuit elements disposed on the substrate 102 as well as with electrical devices off-substrate. Traditionally, signal delivery to and from quantum circuit elements occurs within a plane parallel to a substrate's surface and through bond pads disposed at a perimeter thereof. However, large quantum circuits may include tiled 2D lattices, i.e., stacks of multiple substrates, in which interior quantum circuit elements cannot be accessed from the perimeter. Transmitting signals perpendicular to (and possibly through) the 2D lattices is thus desirable for scalability. Flip-chip processes using superconducting indium bumps can be used to bond one substrate to another, all while allowing readout and control signals between quantum circuit elements with high qubit coherence (i.e., >20 µs). The superconducting via 100 (or a plurality of such vias) can deliver electrical signals at high frequencies (i.e., >1 GHz) through the substrate, thereby allowing 3D integration of multiple instances of the substrate 102.

The via 100 may also improve an electrical isolation of resonators disposed on the substrate 102. To achieve maximum coherence and minimal crosstalk, the resonators would ideally be completely isolated from each other and from their ambient environment, except for engineered couplings. Such configuration would eliminate frequency crowding in quantum integrated circuits having large numbers of resonators. The via 100 is capable of reducing or eliminating this frequency crowding if disposed multiply on the substrate 102 to surround individual instances of resonators. The resulting arrangement would confine electromagnetic modes locally within the substrate 102, thereby reducing electromagnetic interference immediately above the first surface 104 on which the resonators are disposed. A conductive cage or covering above the plane of the substrate 102 could then be utilized to enclose the resonators, isolating the resonators from their ambient environment.

It will be appreciated that the via 100 may alter electromagnetic modes associated with the substrate 102. The substrate 102 may have a dielectric property that induces the substrate 102 to host one or more electromagnetic modes. For example, and without being limited by theory or mode of operation, a thin rectangular substrate with dimensions x and y has a fundamental mode with frequency:

$$f_m = \frac{c}{2\pi\sqrt{\epsilon_r}} \sqrt{\left(\frac{\pi}{x}\right)^2 + \left(\frac{\pi}{y}\right)^2} \tag{1}$$

In Equation (1), c is the speed of light in free space and $\in_r$ is the dielectric constant. For sufficiently large substrates, the fundamental mode falls in an operating frequency range of a superconducting quantum circuit element (i.e., typically 3-10 GHz) and provides a loss channel for an otherwise high-quality resonator. This loss channel places an upper bound on a circuit size and complexity possible for the substrate 102 without otherwise incurring unacceptable losses in signal fidelity. However, multiple instances of the via 100 in the substrate 102 imposes boundary conditions on the fundamental modes, altering the effective dimensions associated with $f_m$ and changing its maximum wavelength an order of spacing between the vias 100. This alteration can raise the lowest-lying frequency mode to well above 10 GHz, thereby eliminating its dependence on substrate size. As such, the substrate 102 can be increased in size to accommodate quantum integrated circuits having large numbers of quantum circuit elements, such as Josephson junctions, resonators, parametric amplifiers, and so forth.

The via 100 may also allow vertical coupling between layers disposed on the substrate 102. The scaling of quantum integrated circuits may sometimes require multi-layer structures disposed on the substrate 102. In such configurations, the fabrication technology used to make the multi-layer structures sets the precision of vertical distances between the multi-layer structures, making capacitive coupling between the layers difficult to engineer. The superconducting via 100 may allow galvanic connection for delivering electrical signals between different planes of the layers, thereby allowing coupling capacitances to be engineered in-planes.

Figure 1B:
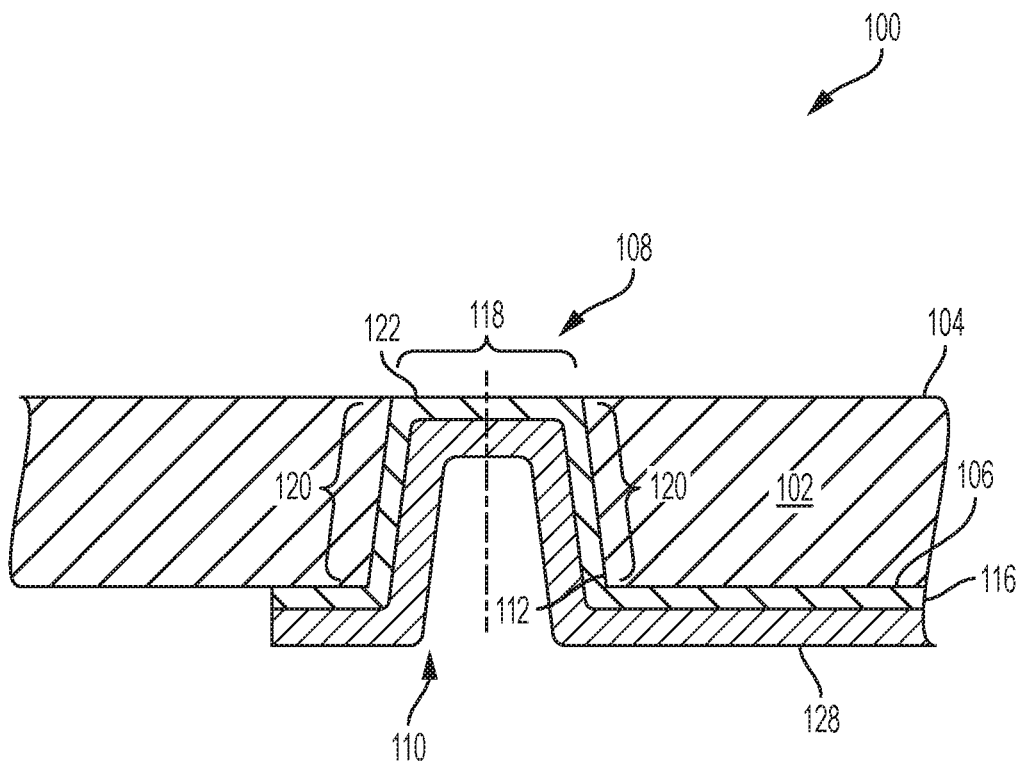
FIG. 1B is a schematic diagram, in cross-section, of the example via of FIG. 1A, but in which a support material is disposed over a layer of superconducting material.

In some embodiments, the via 100 may include a support material disposed over the layer 116 of superconducting material and formed of a polymeric material or an inorganic material. The polymeric material may include Parylene-C, a polyimide, or a photo-definable polymer (e.g., HD Microsystems HD-8820). The inorganic material may include Cu, Ag, Pt, Ti, SiO2, and Pd. For example, the superconducting material of layer 116 of may be titanium nitride and the support material may be a polyimide material. In another embodiment, the superconducting material of layer 116 may be of niobium and the support material may be some thickness of plated copper. In yet another embodiment, the superconducting material may be a multilayer stack comprising one or more layers of thin titanium nitride and thicker niobium and the support material may be a spin-on-glass. FIG. 1B presents a schematic diagram of the example via 100 of FIG. 1A, but in which a support material 128 is disposed over the layer 116 of superconducting material. Not all features of FIG. 1A are labeled in FIG. 1B. The support material may have a thickness ranging from 1 μm to 100 μm.

The support material 128 may be operable to reduce or eliminate a bowing of the substrate 102 during fabrication of the via 100 or other integrated structures (e.g., a quantum circuit element). The support material 128 may also prevent a loss of mechanical integrity during fabrication or operation (e.g., bursting of the first portion 118, delamination of the second portion 120 from the substrate 102, etc.). It will be understood that the substrate 102 and the layer 116 have respective coefficients of thermal expansion (CTE) that may be different. As such, temperature changes may induce expansions (or contractions) that cause stresses to form in and adjacent interfaces of the substrate 102 and the layer 116. The support material 128 may reinforce the layer 116 of superconducting material to better resist mechanical failure that may result from such temperature changes. In some instances, such as depicted in FIG. 1B, the support material 128 is disposed over the layer 116 of superconducting material as a conformal layer. However, this depiction is not intended as limiting. Other configurations of the support material 128 are possible. For example, the support material 128 may be deposited over the layer 116 of superconducting material so as to fill or plug unoccupied space within the cavity 112.

Figure 1C:
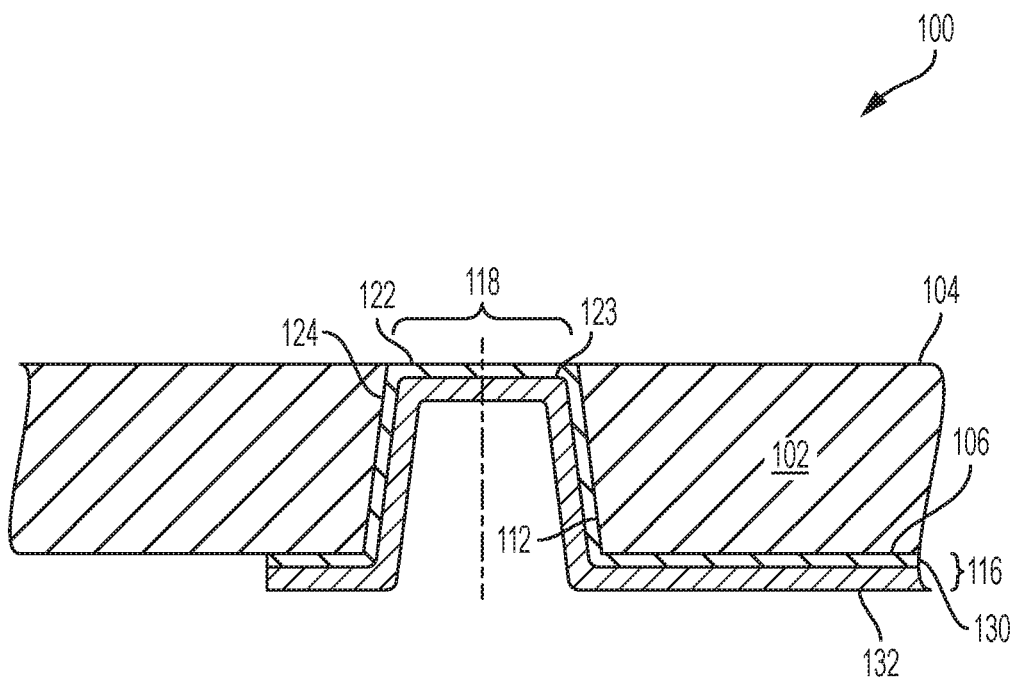
FIG. 1C is a schematic diagram, in cross-section, of the example via of FIG. 1A, but in which a layer of superconducting material is a multi-layer stack having two layers, each formed of a respective superconducting material.

It will be appreciated that the layer 116 of superconducting material is not limited to a single material but may be a composite of multiple superconducting materials, such as a multi-layer stack of superconducting materials. One or more of the layers may serve as a reinforcement layer to prevent high stress levels from emerging, such as those that would warp or bow the substrate 102. This bow reduction may be achieved by, for instance, cycling deposition parameters from compressive regime to tensile regime to achieve a net neutral or near-to-neutral overall film stress. Such parameter tuning may in some cases be achieved by varying the deposition material, power, and/or pressure in a sputtering physical vapor deposition. Additional parameters and film deposition techniques may also be used to achieve this effect. In some implementations, such as shown in FIG. 1C, the layer 116 of superconducting material includes a first layer 130 formed of a first superconducting material and a second layer 132 formed of a second superconducting material. The first layer 130 is in contact with the side wall 124 of the cavity 112 and includes an interior surface 123 of the first portion 118. The second layer 132 is disposed over the first layer 130, which may partially cover the first layer 130 or fully cover the first layer 130. FIG. 1C depicts an embodiment where the first layer 130 is fully covered. The first and second superconducting materials may be any material capable of entering a superconducting state at or below a superconducting critical temperature, as described in relation to FIG. 1A. In some embodiments, the first superconducting material may preferentially be deposited with compressive stress relative to the base substrate, and the second superconducting material may be preferentially deposited with a tensile stress relative to the base substrate. A support material may optionally be disposed over the second layer 132. The support material may be formed of a polymeric material or an inorganic material. In some embodiments, the support material may require a high temperature curing step which may affect the overall wafer stress by oxidizing or otherwise interacting with exposed or otherwise accessible superconducting material. In some embodiments the superconducting materials and support materials may be patterned or otherwise processed in such a way as to reduce stress. In some embodiments, material deposition techniques may result in excess material on the backside of the wafer due to imperfect material transfer into the vias, leading to unnecessarily high overall wafer stress and increasing the challenge of subsequent backside patterning, if desired. Methods during deposition may include shadow masked deposition. Methods after deposition of some or all layers may optionally include, for instance, chemical mechanical polishing or a patterned etch to either thin down or remove excess material on the backside of the wafer. It is conceivable that other techniques, such as lift-off patterning of excess material on the backside of the wafer, may be adapted for these purposes.

For example, the first layer 130 may be formed of niobium with compressive stress, the second layer 132 formed of an alloy of molybdenum and rhenium with tensile stress, and a polyimide material may be disposed over the second layer 132. The second layer 132 may be operable to prevent high stress levels from emerging when the polyimide layer cures at or near 300 degrees Celsius. In some embodiments, the second layer 132 may be deposited in such a way that overall wafer stress decreases after the completion of the polyimide layer cure. Niobium, in particular, is known to exhibit increased stress during polyimide cure steps. In some embodiments this cure-induced stress increase is minimized or even turned into a stress decrease by appropriate selection and engineering of the superconducting material in second layer 132. In this example, the first layer 130 may have a thickness ranging from 0.1 μm to 5 μm, the second layer 132 may have a thickness ranging from 10 nm to 100 nm, and the polyimide material may have a thickness ranging from 1 μm to 100 μm. In a further example, the respective thicknesses of the first layer 130, the second layer 132 and the polyimide material may be about 2 μm, 60 nm, and 5 μm.

Figure 1D:
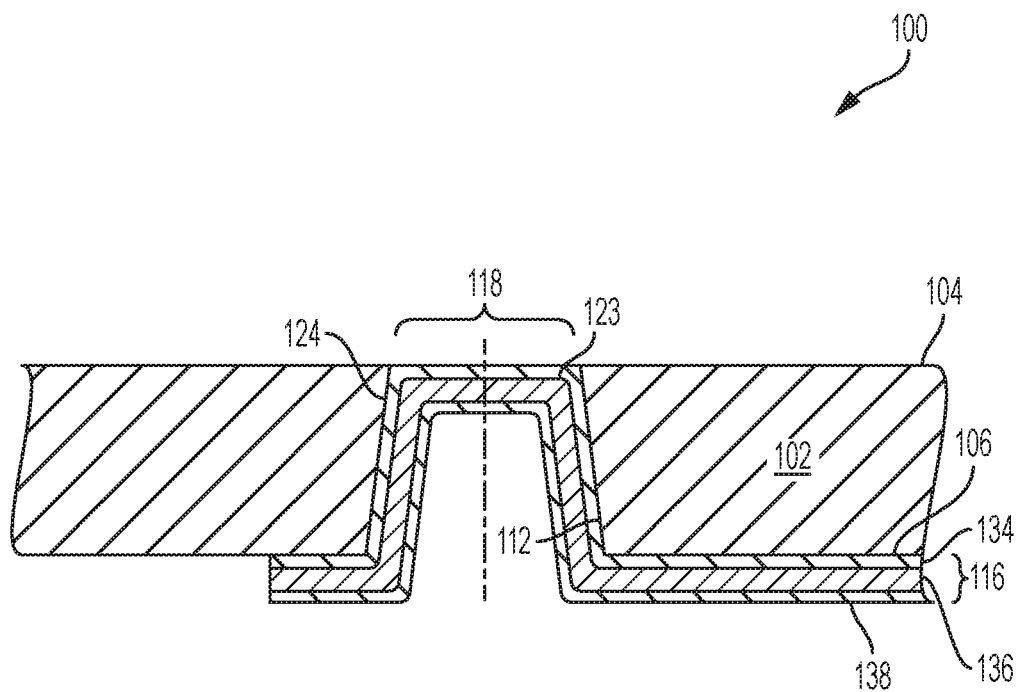
FIG. 1D is a schematic diagram, in cross-section, of the example via of FIG. 1A, but in which a layer of superconducting material is a multi-layer stack having three layers, each formed of a respective superconducting material.

In other implementations, such as shown in FIG. 1D, the layer 116 of superconducting material includes a first layer 134 formed of a first superconducting material, a second layer 136 formed of a second superconducting material, and a third layer 138 formed of a third superconducting material. The first layer 134 is in contact with the side wall 124 of the cavity 112 and includes an interior surface 123 of the first portion 118. The second layer 136 is disposed over the first layer 134 and the third layer 138 is disposed over the second layer 136. The second layer 136 and the third layer 138 may partially or fully cover their respective underlying layers. FIG. 1D depicts an embodiment where the second layer 136 and the third layer 138 fully cover their respective underlying layers. The first, second, and third superconducting materials may be any material capable of entering a superconducting state at or below a superconducting critical temperature, as described in relation to FIG. 1A. Similar to FIGS. 1B & 1C, a support material may optionally be disposed over the third layer 138. The support material may be formed of a polymeric material or an inorganic material.

For example, the first layer 134 may be formed of an alloy of molybdenum and rhenium, the second layer 136 formed of niobium, the third layer 138 formed of an alloy of molybdenum and rhenium, and a polyimide material may be disposed over the third layer 138. The first and third layers 138 may be formed of the same alloy of molybdenum and rhenium, or alternatively, of different alloys of molybdenum and rhenium. The third layer 138 may be operable to prevent high stress levels from emerging when the polyimide layer cures. In this example, the first layer 134 may have a thickness ranging from 10 nm to 100 nm, the second layer 136 may have a thickness ranging from 0.1 μm to 5 μm, the third layer 138 may have a thickness ranging from 10 nm to 200 nm, and the polyimide material may have a thickness ranging from 1 μm to 100 μm. In a further example, the respective thicknesses of the first layer 134, the second layer 136, the third layer 138, and the polyimide material may be about 20 nm, 2 μm, 60 nm, and 5 μm.

In some implementations, such as shown in FIG. 1A, the cavity 112 tapers progressively along a direction from the second orifice 110 to the first orifice 108 (e.g., along the longitudinal axis 114). Such tapering may cause the side wall 124 to have in cross-section a straight profile, a curved profile, or any combination thereof. FIG. 1A depicts the side wall 124 as having a straight profile. In these implementations, the second orifice 110 may enclose an area larger than the first orifice 108. Also in these implementations, the side wall 124 of the cavity 112 may have a taper angle relative to the longitudinal axis 114 (e.g., shaped as a frustum). The taper angle may be equal to or greater than a lower limit, equal to or less than an upper limit, or fall within a range defined by the lower limit and the upper limit.

In some implementations, the taper angle is at least 10°. In some implementations, the taper angle is at least 11°. In some implementations, the taper angle is at least 12°. In some implementations, the taper angle is at least 13°. In some implementations, the taper angle is at least 14°. In some implementations, the taper angle is at least 15°. In some implementations, the taper angle at least 16°. In some implementations, the taper angle is at least 17°. In some implementations, the taper angle is at least 18°. In some implementations, the taper angle is at least 19°. In some implementations, the taper angle is at least 20°. In some implementations, the taper angle is at least 21°. In some implementations, the taper angle is at least 22°. In some implementations, the taper angle is at least 23°. In some implementations, the taper angle is at least 24°.

In some implementations, the taper angle is no more than 25°. In some implementations, the taper angle is no more than 24°. In some implementations, the taper angle is no more than 23°. In some implementations, the taper angle is no more than 22°. In some implementations, the taper angle is no more than 21°. In some implementations, the taper angle is no more than 20°. In some implementations, the taper angle is no more than 19°. In some implementations, the taper angle is no more than 18°. In some implementations, the taper angle is no more than 17°. In some implementations, the taper angle is no more than 16°. In some implementations, the taper angle is no more than 15°. In some implementations, the taper angle is no more than 14°. In some implementations, the taper angle is no more than 13°. In some implementations, the taper angle is no more than 12°. In some implementations, the taper angle is no more than 11°.

It will be appreciated that the lower limit and the upper limit of the taper angle may be combined in any variation as above to define the range. For example, the taper angle may be at least 10° but no more than 25°. In another example, the taper angle may be at least 14° but no more to 17°. In yet another example, the taper angle may be at least 12° but no more than 20°. Other combinations of the lower limit and the upper limit are possible for the range.

In further implementations, the side wall 124 has a curved cross-sectional profile that starts with the taper angle proximate the second orifice 110 and ends with a terminating angle at the first orifice 108. The terminating angle may be greater than the taper angle by no more than 10°. In some instances, the terminating angle is greater than the taper angle by no more than 9°. In some instances, the terminating angle is greater than the taper angle by no more than 8°. In some instances, the terminating angle is greater than the taper angle by no more than 7°. In some instances, the terminating angle is greater than the taper angle by no more than 6°. In some instances, the terminating angle is greater than the taper angle by no more than 5°. In some instances, the terminating angle is greater than the taper angle by no more than 4°. In some instances, the terminating angle is greater than the taper angle by no more than 3°. In some instances, the terminating angle is greater than the taper angle by no more than 2°. In some instances, the terminating angle is greater than the taper angle by no more than 1°.

In some implementations, the via 100 includes a quantum circuit element disposed on the first surface 104 and electrically coupled to the exterior surface 122 of the first portion 118 of the layer 116 of superconducting material. Non-limiting examples of the quantum circuit element include a superconducting qubit, a resonator, a Josephson parametric amplifier, and a traveling-wave parametric amplifier. The quantum circuit elements may be configured to operating at microwave frequencies (i.e., 1-15 GHz). In certain variations, the quantum circuit elements are configured to operate at microwave frequencies equal to or greater than 3 GHz but less than and equal to 8 GHz. In some variations, the minimum operation frequency may be equal to or greater than 5 GHz but less than and equal to 7 GHz; some instances 6 GHz to 8 GHz, some instances 3 GHz to 5 GHz, some instances 10 GHz to 15 GHz, some instances 7 GHz to 14 GHz.

As disclosed above, the superconducting material of the layer 116 can enter a superconducting state at or below a superconducting critical temperature. In some implementations, the superconducting material has a superconducting critical temperature equal to or less than 77 K. In some implementations, the superconducting material has a superconducting critical temperature equal to or less than 50 K. In some implementations, the superconducting material has a superconducting critical temperature equal to or less than 40 K. In some implementations, the superconducting material has a superconducting critical temperature equal to or less than 30 K. In some implementations, the superconducting material has a superconducting critical temperature equal to or less than 25 K. In some implementations, the superconducting material has a superconducting critical temperature equal to or less than 20 K. In some implementations, the superconducting material has a superconducting critical temperature equal to or less than 15 K. In some implementations, the superconducting material has a superconducting critical temperature equal to or less than 10 K. In some implementations, the superconducting material has a superconducting critical temperature equal to or less than 5 K. In some implementations, the superconducting material has a superconducting critical temperature equal to or less than 4 K. In some implementations, the superconducting material has a superconducting critical temperature equal to or less than 3 K. In some implementations, the superconducting material has a superconducting critical temperature equal to or less than 2 K. In some implementations, the superconducting material has a superconducting critical temperature equal to or less than 1 K. In some implementations, the superconducting material has a superconducting critical temperature equal to or less than 100 mK. In some implementations, the superconducting material has a superconducting critical temperature equal to or less than 10 mK.

As disclosed above, the exterior surface 122 may lie in-plane with the first surface 104, above-plane of the first surface 104, or below-plane of the first surface 104. In particular, the exterior surface 122 may be offset relative to the first surface 104, i.e., offset above the first surface 104 or offset below the first surface 104. The offset may be equal to or greater than a lower limit, equal to or less than an upper limit, or fall within a range defined by the lower limit and the upper limit.

In some implementations, the offset is at least 1 µm. In some implementations, the offset is at least 5 µm. In some implementations, the offset is at least 10 µm. In some implementations, the offset is at least 20 µm. In some implementations, the offset is at least 30 µm. In some implementations, the offset is at least 40 µm.

In some implementations, the offset is no more than 50 µm. In some implementations, the offset is no more than 40 µm. In some implementations, the offset is no more than 30 µm. In some implementations, the offset is no more than 20 µm. In some implementations, the offset is no more than 10 µm. In some implementations, the offset is no more than 5 µm. In some implementations, the offset is no more than 1 µm.

It will be appreciated that the lower limit and the upper limit of offset may be combined in any variation as above to define the range. For example, the offset may be at least 5 µm but no more than 10 µm. In another example, the offset may be at least 20 µm but no greater more 40 µm. In yet another example, the offset may be at least 30 µm but no greater than 50 µm. Other combinations of the lower limit and the upper limit are possible for the range.

In some implementations, the substrate 102 is a silicon substrate, which may be a high-resistivity silicon substrate (i.e., $\rho > 10^5$ Ω·cm). In these instances, the substrate 102 may be a single-crystal substrate and may have intrinsic, n-type, or p-type doping. The first surface 104 and the second surface 106 of the substrate 102 may be oriented parallel to a crystallographic plane of silicon, such as the (100), (110), and (111) crystallographic planes.

In some implementations, the substrate 102 is a silicon substrate and the layer 116 of superconducting material has a coefficient of thermal expansion (CTE) that generally ranges from 5 to 11 ppm/degree C. In some cases, superconducting materials with CTE lower than that of copper are used. For reference, the CTE of aluminum typically ranges from 21-24 ppm/degree C., and the CTE of copper typically ranges from 15-17 ppm/degree C. The coefficient of thermal expansion of the superconducting material may be equal to or greater than a lower limit, equal to or less than an upper limit, or fall within a range defined by the lower limit and the upper limit. In some cases, the upper limit is 5 ppm/degree C. or 2 ppm/degree C. In some cases, the lower limit is 0 ppm/degree C. or a negative value. For reference, the CTE of Nb is typically 7 ppm/degree C.; the CTE of MoRe is typically about 5.7; the CTE of Parylene-c is typically 35; the CTE of BCB is 42, the CTE of Alumina is 8.4. Another factor that may be considered is Young's Modulus. For reference, the Young's Modulus of Si is typically 140 GPa, the Young's Modulus of Parylene-c is typically 2.8 GPa, the Young's Modulus of $Al_2O_3$ is typically 375 GPa, the Young's Modulus of MoRe is typically 350 GPa, the Young's Modulus of Nb is typically 105 GPa, the Young's Modulus of Al is typically 70 GPa, the Young's Modulus of PBO is typically 2.3 GPa, the Young's Modulus of Cu is typically 117 GPa. In some embodiments, lower CTE and higher Young's Modulus can be advantageous. For instance, CTE close to silicon may avoid stress concentration and cracking during thermal change, and a higher modulus will generally produce a stiffer membrane. Stiffness goes up with approximately thickness cubed, so changing the thickness of a material of fixed modulus from 1 µm to 10 µm results in a membrane about 1000 times stiffer. Polymers generally have a low modulus. In an example, a polyimide (non-patternable, PI-2610 from HD Microsystems) and PBO (patternable, HD-8820) have moduli of about 8.5 and 2.3 respectively, and their CTEs are about 3 and 64, respectively.

The vias 100 described in relation to FIGS. 1A-1D may provide a planar (or near-planar) surface for additional downstream processing, e.g., to fabricate a quantum circuit element on the first surface 104 of the substrate 102. This configuration is beneficial when fabricating Josephson junctions by conventional techniques. Such techniques often rely on low-viscosity electron beam lithographic resists (e.g., polymethyl methacrylate), which tend to leak through holes. However, the membrane structure of the vias 100 (i.e., the first portion 118 of the layer 116) occludes the first orifice 108 in the first surface 104 of the substrate 102, preventing lithographic resists from leaking through. As a result, dimensional features of the Josephson junction are readily fabricated to their desired target values. The configuration of the vias 100 also allows the vias 100 to be fabricated in a state of low stress, thereby reducing their risk of rupture during thermal cycling.

It will be appreciated that the vias 100 may be fabricated before any quantum circuit element on the first surface 104 of the substrate 102. As a result, the quantum circuit elements can be exposed to a lower number of process environments, which is particularly beneficial for Josephson junctions. The operating behavior of a Josephson junction is heavily influenced by its insulating barrier, which determines a resistance of the Josephson junction. Exposing a Josephson junction to multiple process environments may undesirably alter one or more characteristics of the insulating barrier (e.g., an oxidation level, a thickness, an area, etc.). As a result, control over the junction resistance is poor or negated and its performance post-fabrication may be degraded. By allowing quantum circuit elements to be fabricated downstream, and in particular Josephson junctions, the vias 100 can improve the ease with which the quantum circuit elements are fabricated and the reproducibility of their operating behavior.

Figure 2A:
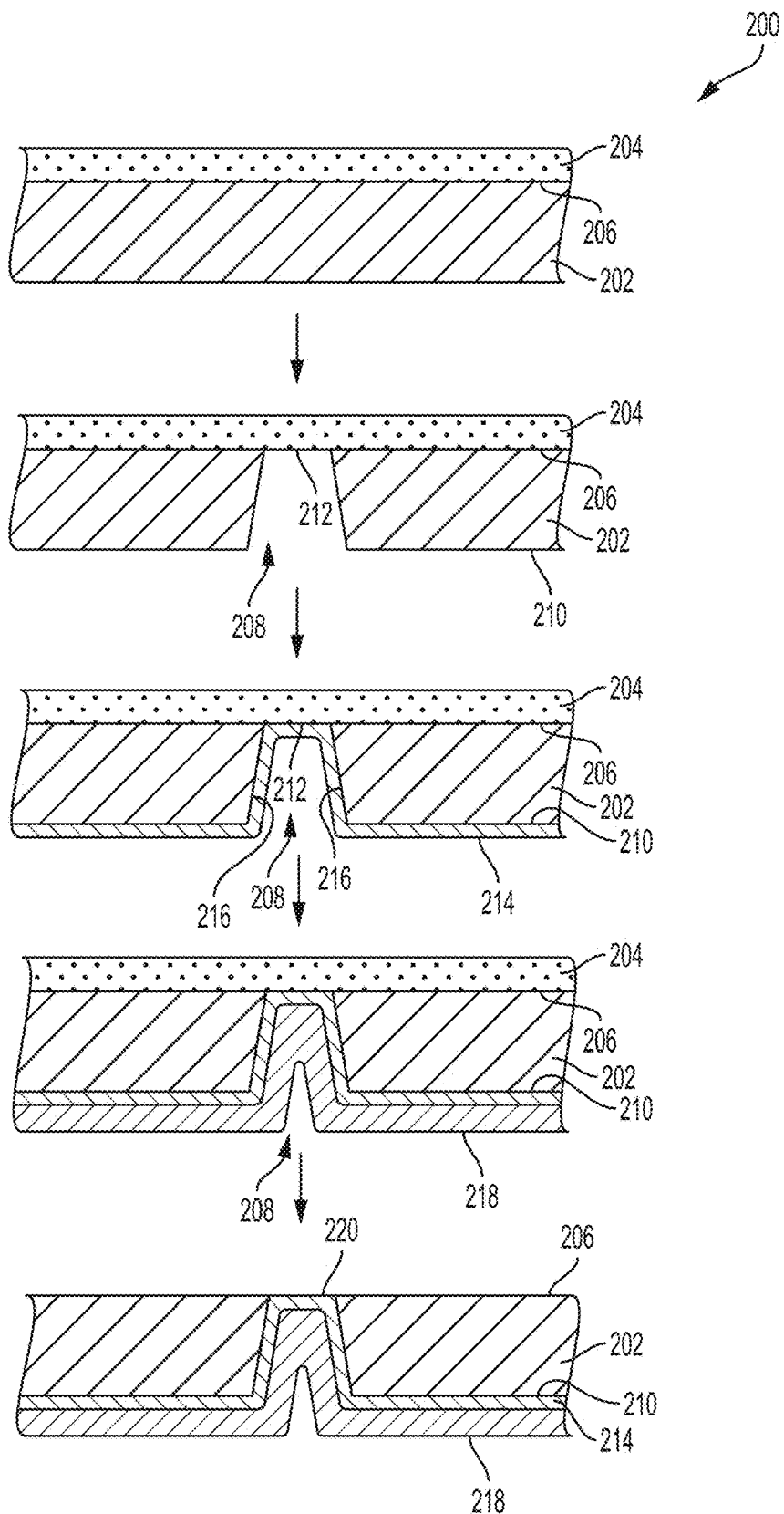
FIG. 2A is a schematic diagram, in cross section, of an example method of fabricating a superconducting via for routing electrical signals through a substrate.

Now referring to FIG. 2A, a schematic diagram is presented, in cross section, of an example method 200 of fabricating a superconducting via for routing electrical signals through a substrate 202. Successive steps of the example method 200 are represented by arrows. The method 200 includes depositing an etch-stop layer 204 onto a first surface 206 of the substrate 202. The etch-stop layer 204 may cover the entire first surface 206 of the substrate 202, or alternatively, may be a patterned layer that covers a selective portion of the first surface 206. The etch-stop layer 204 may be formed of any material resistive or inert to processes capable of etching away the substrate 202 to form a cavity. Examples of such materials include photoresist materials, silicon oxynitride materials (i.e., $Si_xO_yN_z$), metals (e.g., Aluminum), and aluminum oxide materials (i.e., $Al_xO_y$) such as sapphire. Examples of processes capable of etching away the substrate 202 include deep reactive ion etching (DRIE) and laser milling. However, other materials and processes are possible.

The method 200 also includes etching a cavity 208 through the substrate to the etch-stop layer 204. The cavity 208 extends from a second surface 210 of the substrate 202 to an interior surface 212 of the etch-stop layer 204. The interior surface 212 may lie along a plane shared common with the first surface 206, such as shown in FIG. 2A. Alternatively, the interior surface 212 may result from etching past the first surface 206 and thus lie within the etch-stop layer 204. This alternate variation may allow the via to have an exterior surface lying above-plane of the first surface 206 when the method 200 is completed. Etching the cavity 208 may be assisted by first depositing a layer of photoresist over the second surface 210 of the substrate 202 and lithographically patterning the layer of photoresist to produce a void therein. The void is operable to expose an area on the second surface 210 that will transition into an orifice when the cavity 208 is etched. Etching may occur through deep reaction ion etching, laser milling, or some combination thereof. Other material-removal processes may also be involved in etching the cavity 208. It will be appreciated that an etch rate of the etch-stop layer 204 is lower than an etch-rate of the substrate 202, and may be substantially so (i.e., greater than 2 orders of magnitude slower).

The method 200 additionally includes depositing a layer 214 of superconducting material onto the interior surface 212 of the etch-stop layer 204 and a side wall 216 of the cavity 208. The layer 214 of superconducting material is in direct contact with the substrate 202 along the side wall 216 of the cavity 208. As such, no insulating or dielectric material interrupts such contact, as is commonly found with vias for classical, non-quantum circuits. The superconducting material may be any material capable of entering a superconducting state at or below a superconducting critical temperature, as previously described in relation to FIGS. 1A-1D. In some implementations, such as shown in FIG. 2A, depositing the layer 214 of superconducting material includes depositing the layer 214 of superconducting material onto an area of the second surface 210. FIG. 2A depicts the layer 214 of superconducting material as covering an entire area of the second surface 210. However, this depiction is not intended as limiting. The layer 214 of superconducting material may be a patterned layer that covers a selective area (or areas) of the second surface 210.

In some implementations, the cavity 208 tapers progressively from the second surface 210 to the etch-stop layer 204. Such tapering may cause the side wall 216 to have in cross-section a straight profile, a curved profile, or any combination thereof. FIG. 2A depicts the side wall 216 as having a straight profile. In these implementations, the side wall 216 of the cavity 208 may have a taper angle relative to a longitudinal axis (e.g., be shaped as a frustum). The taper angle may be equal to or greater than a lower limit, equal to or less than an upper limit, or fall within a range defined by the lower limit and the upper limit, as disclosed above.

In some implementations, such as shown in FIG. 2A, the first surface 206 and the second surface 210 are planar surfaces parallel to each other. Moreover, the cavity 208 extends through the substrate 202 along a longitudinal axis perpendicular to the first and second surfaces 206, 210. However, the depiction of FIG. 2A is for purposes of illustration only. The first surface 206 and the second surface 210 may be at angles relative to each other. The first surface 206 and the second surface 210 also need not be planar. For example, the first and second surfaces 206, 210 may be curved or faceted. Furthermore, the cavity 208 may extend through the substrate 202 along an axis that is not perpendicular to the first and second surfaces 206, 210.

In some implementations, the method 200 includes depositing a support material 218 over the layer 214 of superconducting material. The support material 218 may be a polymeric material or a metallic material, as described in relation to FIGS. 1A-1D. The support material 218 may be operable to reduce or eliminate a bowing of the substrate 202 during fabrication of the via or other integrated structures (e.g., a quantum circuit element). The support material 218 may be disposed over the layer 214 of superconducting material as a conformal layer. Alternatively, the support material 218 may be deposited over the layer 214 of superconducting material so as to fill or plug unoccupied space within the cavity 208.

It will be understood that the layer 214 of superconducting material may form a multi-layer stack of superconducting materials (e.g., a two-layers, three-layers, etc.). In some implementations, depositing the layer 214 of superconducting material includes depositing a first layer of superconducting material onto the interior surface 212 of the etch-stop layer 204 and the side wall 216 of the cavity 208 and depositing a second layer of material over the first layer of superconducting material. A support material may optionally be disposed over the second layer of superconducting material. In some implementations, depositing the layer 214 of superconducting material includes depositing a first layer of superconducting material onto the interior surface 212 of the etch-stop layer 204 and the side wall 216 of the cavity 208 and depositing a second layer of material over the first layer of superconducting material. A third layer of superconducting material is then deposited over the second layer of superconducting material. A support material may optionally be disposed over the third layer of superconducting material.

In some implementations, the method 200 includes removing the etch-stop layer 204 from the first surface 206 of the substrate 202, thereby exposing an exterior surface 220 of the layer 214 of superconducting material. Such may involve contacting the etch-stop layer 204 with a solution, such as through spray or immersion. The solution may be adapted to a chemistry of the etch-stop layer 204. For example, the patterned etch-stop layer may be formed of photoresist and the solution may be a solvent capable of dissolving the photoresist. In another example, the patterned etch-stop layer may be formed of a silicon oxynitride material (i.e., $Si_xO_yN_z$) and the solution may be a buffered etch solution, such as a buffered oxide etch (BOE) solution. In another example, the patterned etch-stop layer may be formed of a thermally grown silicon oxide and the solution may be a buffered etch solution. In another example, the patterned etch-stop may be formed of aluminum and the solution may be phosphoric acid.

After removal of the etch-stop layer 204, the method 200 may include removing material from layer 214 of superconducting material to recess the exterior surface 220 within the cavity 208. Such removal may include an etching process, such as reactive ion etching. This additional step may allow the via to have an exterior surface lying below-plane of the first surface. FIG. 2A depicts the step of removing the etch-stop layer 204 as occurring after the step of depositing the support material 218. However, the depiction of FIG. 2A is not intended as limiting. The step of removing the etch-stop layer 204 may occur before the step of depositing the support material 218.

Figure 2B:
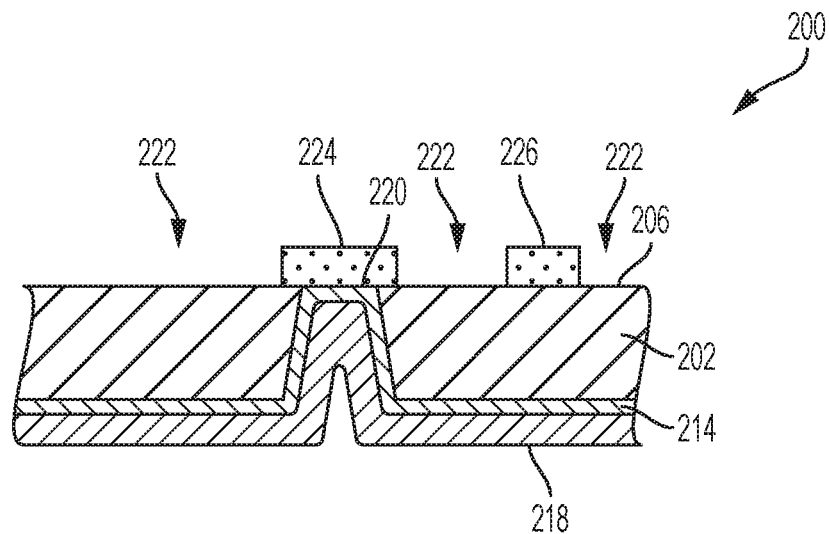
FIG. 2B is a schematic diagram, in cross section, of the via of FIG. 2A, but in which an etch-stop layer includes voids to reveal selected areas of a first surface of the substrate.

In some implementations, the method 200 includes selectively removing a portion of the etch-stop layer 204 to produce a patterned etch-stop layer on the first surface 206 of the substrate 202. Such selective removal may create: [1] voids in the patterned etch-stop layer that reveal selected areas of the first surface 206, and [2] thinned thicknesses (or volumes) in the patterned etch-stop layer. FIG. 2B presents a schematic diagram, in cross section, of the via 200 of FIG. 2A, but in which the etch-stop layer 204 includes voids 222 to reveal selected areas of the first surface 206. The selective areas may define covered regions that the patterned etch-stop layer protects from other fabrication processes, protects from exposure to the ambient environment, or both. For example, in FIG. 2A a first remaining portion 224 covers the exterior surface 220, which may serve to prevent potential surface damage, contamination, or both, from material removal processes (e.g., deep reactive ion etching, laser milling, etc.). Similarly, a second remaining portion 226 covers a region of the first surface 206 on which a surface-sensitive quantum circuit element (e.g., a Josephson junction) may later be fabricated.

In some implementations, the method 200 includes depositing an overlayer of superconducting material over the etch-stop layer 204. For example, an overlayer of niobium may be deposited over an etch-stop layer of aluminum oxide material (e.g., sapphire). In further implementations, the method 200 includes selectively removing a portion of the overlayer of superconducting material to produce a patterned overlayer of superconducting material and selectively removing a portion of the etch-stop layer 204 to produce a patterned etch-stop layer on the first surface 206 of the substrate 202. Such selective removal may create: [1] voids in the patterned overlayer of superconducting material that reveal selected areas of the patterned etch-stop layer, [2] voids in the patterned etch-stop layer that reveal selected areas of the first surface 206, and [3] thinned thicknesses (or volumes) in the patterned etch-stop layer.

Figure 2C:
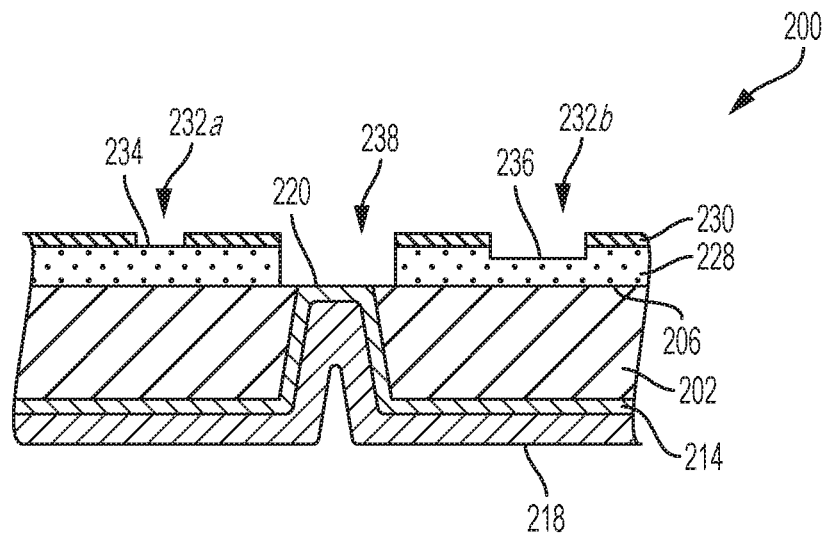
FIG. 2C is a schematic diagram, in cross section, of the via of FIG. 2A, but in which a patterned etch-stop layer and a patterned overlayer of superconducting material have been formed on a first surface of the substrate.

FIG. 2C presents a schematic diagram, in cross section, of the via 200 of FIG. 2A, but in which a patterned etch-stop layer 228 and a patterned overlayer 230 of superconducting material have been formed on the first surface 206. A first void 232a in the patterned overlayer 230 of superconducting material reveals a surface 234 of the patterned etch-stop layer 228 at an interface between the two layers. A second void 232b in the patterned overlayer 230 extends partially into the patterned etch-stop layer 228 to create a thinned volume 236 therein. A third void 238 extends through both the patterned overlayer 230 and the etch-stop layer 228 to reveal the exterior surface 220 of the layer 214 of superconducting material. The voids 232, 236, 238 may be used to form features of quantum circuits. For example, the patterned overlayer 230 of superconducting material may be formed of niobium and the patterned etch-stop layer 228 formed of an aluminum oxide material (e.g., sapphire). The void 232 and the surface 234 are then used to fabricate a Josephson junction on the patterned etch-stop layer 228 (not shown). In this example, it will be appreciated that the patterned etch-stop layer 228 effectively serves as a substrate for features of the quantum circuit.

Figure 7:
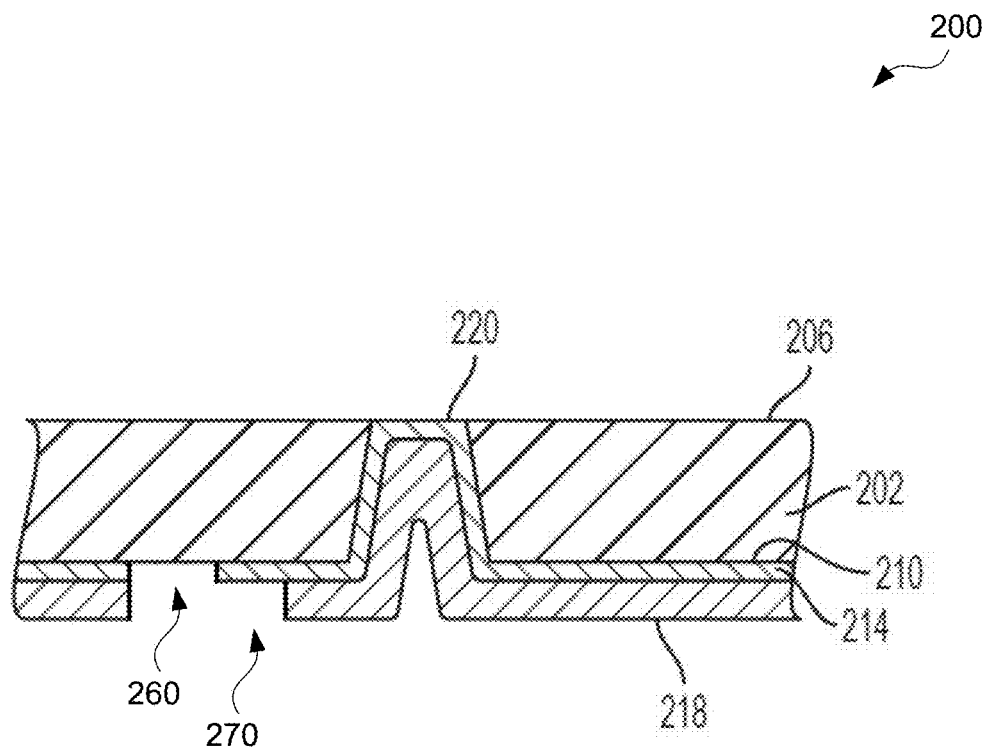
FIG. 7 is a schematic diagram, in cross section, of an example substrate.

It will be understood that the method 200 described in relation to FIGS. 2A-2C may serve as part of an extended fabrication method that is used to fabricate features on the first surface 206 of the substrate 202 (i.e., a top-side or device-side surface). These features may correspond to a quantum circuit (e.g., quantum circuit element, electrical traces, etc.). The extended fabrication method may also fabricate features on the second surface 210 of the substrate 202 (i.e., a backside or interposer-side surface). Such features may correspond to bond pads, electrical pads, or other structures that allow integration of the quantum circuit (and substrate 200) in a 3D package. In some implementations, the features on the first surface 206 have dimensions smaller (or finer) than features on the second surface 210. FIG. 7 is a schematic diagram, in cross section, of the example substrate from FIG. 2A. As shown in FIG. 7, in some cases, the method 200 may further include selectively removing one or more portions of the support material 218 to expose at least a portion of the layer 214 of superconducting material on an area (shown at 270) over the second surface 210. This exposed portion of the layer 214 of superconducting material may be used for conductive electrical contact (e.g., through a bond) with another substrate, for example, for signaling between substrates. As shown in FIG. 7, in some cases, the method 200 may further include selectively removing one or more portions of the superconducting material to expose at least a portion of an area of the second surface 210. In some cases, both the support material 218 and superconducting material 214 may be removed in the same area (e.g., shown at 260) in order to either or both facilitate electrical isolation between vias and clear excess material from chip borders or between chips. This may be required, for instance, for compatibility with common chip singulation methods, such as laser dicing or to minimize wear on dicing saw blades.

In some implementations of the method 200, the etch-stop layer 204 is removed entirely before continuing with the extended fabrication method. As a result, the first surface 206 of the substrate 202 experiences a blanket reveal.

Figure 3:
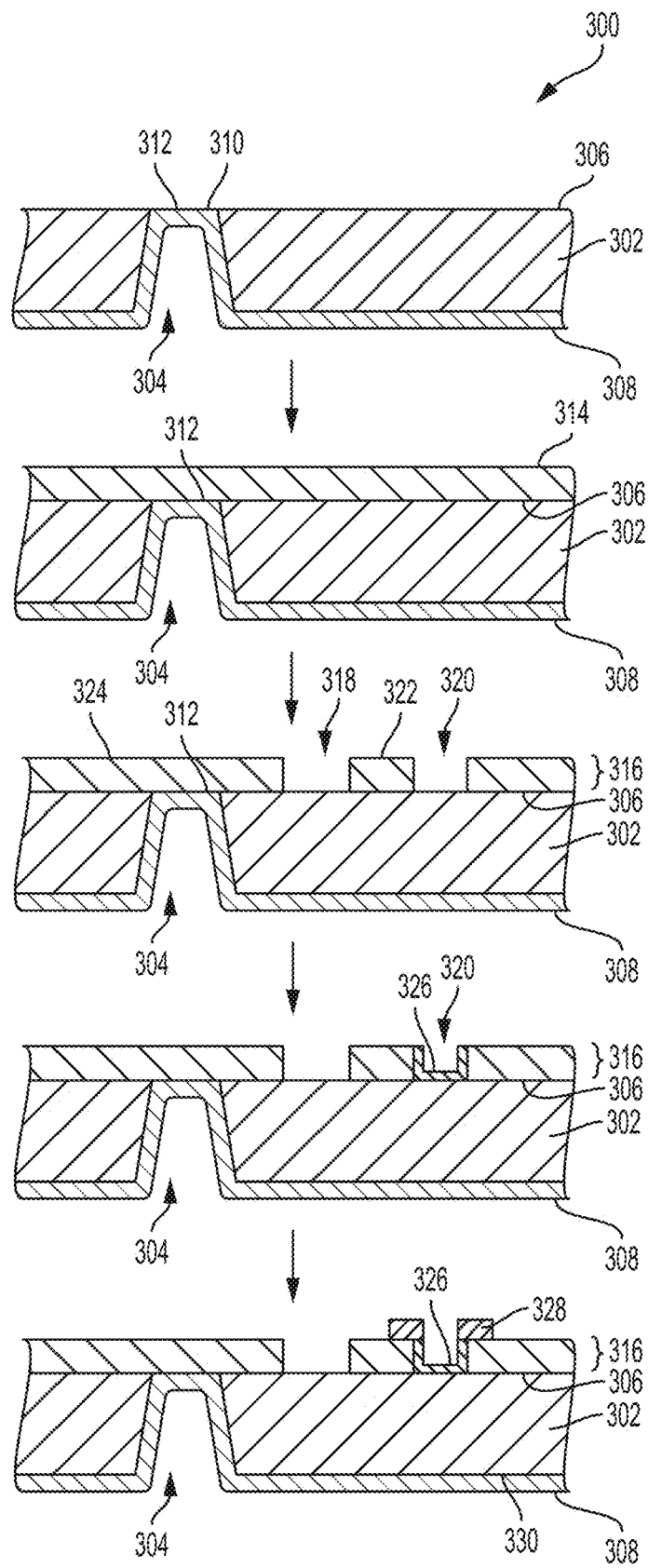
FIG. 3 is a schematic diagram of an example method for fabricating a quantum circuit on a substrate having a superconducting via and a first surface that is fully uncovered.

FIG. 3 presents a schematic diagram of an example method 300 for fabricating a quantum circuit on a substrate 302 having a superconducting via 304 and a first surface 306 that is fully uncovered. The example method 300 may be downstream of the method 200 described in relation to FIGS. 2A-2C and may be part of an extended fabrication method. As such, other features or devices may be fabricated upon completion of the example method 300 (e.g., electrical pads, bond pads, etc.). The superconducting via 304 includes a layer 308 of superconducting material and may be formed by the method 200 described in relation to FIGS. 2A-2C. The layer 308 includes a first portion 310 having an exterior surface 312 facing outward from the substrate 302. The first portion 310 defines a membrane structure of the superconducting via 304 that occludes a first orifice disposed on the first surface 306 of the substrate 302.

The method 300 includes depositing a first-side layer 314 of superconducting material on the first surface 306 of the substrate 302. For example, a layer formed of niobium may be deposited on the first surface 306. The layer may have a thickness of about 200 nm. The first-side layer 314 may cover the exterior surface 312 of the superconducting via 304, such as shown in FIG. 3.

The method 300 also includes selectively removing a portion of the first-side layer 314 of superconducting material to produce a patterned first-side layer 316 of superconducting material. Selectively removing the portion may include an etching process, such as reactive ion etching. Such selective removal may create voids 318, 320 in the patterned first-side layer 316 that reveal selected areas of the first surface 306, and may create superconducting traces 322, 324 for carrying electrical current. In some instances, a void may be patterned to reveal the exterior surface 312 of the superconducting via 304.

The method 300 additionally includes fabricating a quantum circuit element 326 in a void of the patterned first-side layer 316 of superconducting material (i.e., proximate the void 320). Fabricating the quantum circuit element 326 may involve a milling process to shape the quantum circuit element 326, e.g., laser milling, focused ion-beam milling, and so forth. However, in many implementations, a milling process is not used. The absence of the milling process may reduce or eliminate mechanical damage or chemical contamination on the first surface 306, on a surface of the patterned first-side layer 316, or both.

The method 300 further includes depositing an overlayer of superconducting material over the patterned first-side layer 316 and then selectively removing a portion of the overlayer to produce a patterned overlayer 328 of superconducting material. Such selective removal may include a milling process, e.g., laser milling, focused ion-beam milling, and so forth. The patterned overlayer 328 may serve to electrically couple the quantum circuit element 326 to the patterned first-side layer 316 (e.g., via a connecting trace defined by the patterned first-side layer 316), such as through a "bandage" process as described below.

In some embodiments, a "bandage" process can be used in the method 300. In some examples, once the etch-stop is removed and the superconducting membrane is exposed, that membrane will have some native oxide or oxide induced by downstream process steps (e.g., a softbake process). That oxide can be removed during subsequent metal deposition to ensure a low-resistance or superconducting contact between the via membrane and subsequent metallization. In some cases, removal by in-situ RF etch or ion mill may damage the substrate that will go under the metal (the silicon is roughened), which can negatively impact qubit coherence time and the quality factor of resonators. To avoid this, a device-side patterned metal may be deposited first on pristine silicon, without milling or etching the surface underneath. That metal can be removed from certain areas including from over the vias. A second metal deposition and patterning can then be performed with ion milling and/or etching in-situ before metal deposition in order to break that surface oxide, for instance, such that only a small area of silicon with metal over it is roughened before deposition (e.g., a ring-shaped area around the via). This technique can provide good contact to vias, reducing the risk to the via and avoiding the need to mill under the rest of the metal surface in some cases.

It will be appreciated that the method 300 may be used to fabricate one or more quantum circuit elements (e.g., a Josephson junction, a resonator, a parametric amplifier, etc.) and one or more traces on the first surface 306 of the substrate 302 that define the quantum circuit (or a part thereof). The one or more superconducting traces may be operable to transmit electrical current between quantum circuit elements on the first surface 306. The one or more superconducting traces may also be operable to transmit electrical current between a quantum circuit element on the first surface 306 and an electrical structure (e.g., a bond pad, an electrical pad, a solder ball, etc.) on a second surface 330 of the substrate 302. As such, the method 300 is capable of fabricating quantum circuits capable of routing superconducting electrical signals through the substrate 302.

Now referring back to FIGS. 2A-2C, in some implementations, the method 200 may produce a substrate having an etch-stop layer that is partially removed. As a result, the first surface 206 of the substrate 202 experiences a partial reveal. In these implementations, a patterned etch-stop layer remains to protect selected areas of the first surface 206 from mechanical damage, chemical contamination, or both. The etch-stop layer may be thinned prior to selective removal to produce the patterned etch-stop layer.

Figure 4:
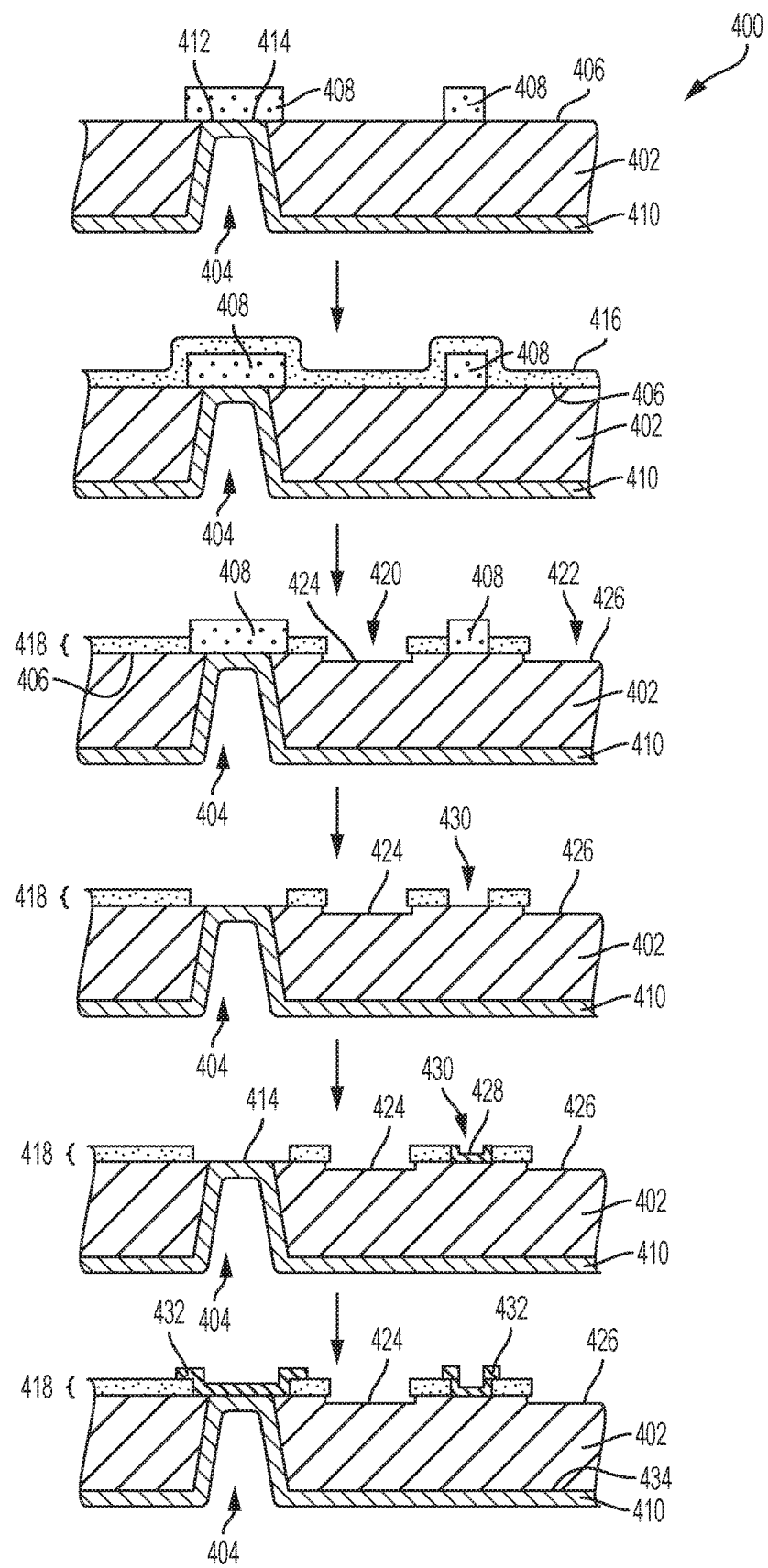
FIG. 4 is a schematic diagram of an example method for fabricating a quantum circuit on a substrate having a superconducting via and a first surface that is partially covered by a patterned etch-stop layer.

FIG. 4 presents a schematic diagram of an example method 400 for fabricating a quantum circuit on a substrate 402 having a superconducting via 404 and a first surface 406 that is partially covered by a patterned etch-stop layer 408. The example method 400 may be downstream of the method 200 described in relation to FIGS. 2A-2C and may be part of an extended fabrication method. As such, other features or devices may be fabricated upon completion of the example method 400 (e.g., electrical pads, bond pads, etc.). The superconducting via 404 includes a layer 410 of superconducting material and may be formed by the method 200 described in relation to FIGS. 2A-2C. The layer 410 includes a first portion 412 having an exterior surface 414 that faces outward from the substrate 402. The first portion 412 defines a membrane structure of the superconducting via 404 that occludes a first orifice disposed on the first surface 406 of the substrate 402. In FIG. 4, the patterned etch-stop layer 408 is depicted as covering the exterior surface 414. However, this depiction is not intended as limiting. The exterior surface 414 may be uncovered in some instances.

The method 400 includes depositing a first-side layer 416 of superconducting material over the patterned etch-stop layer 408 and the first surface 406 of the substrate 402. For example, a layer formed of an alloy of molybdenum and rhenium may be deposited over the patterned etch-stop layer 408. The layer may have a thickness of about 200 nm.

The method 400 also includes selectively removing a portion of the first-side layer 416 to produce a patterned first-side layer 418 of superconducting material. Such selective removal may include an etching process, such as reactive ion etching. The selective removal may create voids 420, 422 in the patterned first-side layer 418 that reveal selected areas of the first surface 406, and may create one or more superconducting traces for carrying electrical current. In some instances, such as shown in FIG. 4, selectively removing the portion of the first-side layer 416 includes removing a portion of the substrate 402 to produce a recessed surface that sits below-plane of the first surface 406 (i.e., within the substrate 402). In FIG. 4, the substrate 402 is depicted as having two recessed surfaces 424, 426. However, this depiction is for purposes of illustration only. Other numbers of the recessed surfaces are possible.

The method 400 additionally includes removing the patterned etch-stop layer 408, thereby exposing selected areas of the substrate 402, e.g., exposing the exterior surface 414 of the superconducting via 404. Removing the patterned etch-stop layer may involve contacting the patterned etch-stop layer with a solution, such as a buffered etch solution or an organic solvent. The solution is adapted to a chemistry of the patterned etch-stop layer. For example, the patterned etch-stop layer may be formed of a silicon oxynitride material (i.e., $Si_xO_yN_z$) and the solution is a buffered etch solution, such as a buffered oxide etch (BOE) solution. The selected areas may correspond to surfaces upon which features of the quantum circuit will subsequently be fabricated, such as a quantum circuit element or a connecting trace.

The method 400 further includes fabricating a quantum circuit element 428 in a void 430 of the patterned first-side layer 418 (or proximate the void 430). Fabricating the quantum circuit element 428 may involve a milling process to shape the quantum circuit element 428, e.g., laser milling, focused ion-beam milling, and so forth. However, in many implementations, a milling process is not used. The absence of the milling process may reduce or eliminate mechanical damage or chemical contamination on the first surface 406, on a surface of the patterned first-side layer 418, or both.

The method 400 still further includes depositing an overlayer of superconducting material over the patterned first-side layer 418 and then selectively removing a portion of the overlayer to produce a patterned overlayer 432 of superconducting material. Such selective removal may include a milling process, e.g., laser milling, focused ion-beam milling, and so forth. The patterned overlayer 432 may serve to electrically couple the quantum circuit element 428 to the patterned first-side layer 418 (e.g., via a connecting trace defined by the patterned first-side layer 316), such as through a "bandage" process. The "bandage" process described above may be used in some cases.

The method 400 may be used to fabricate one or more quantum circuit elements (e.g., a Josephson junction, a resonator, a parametric amplifier, etc.) and one or more traces on the first surface 406 of the substrate 402 that define the quantum circuit (or a part thereof). The one or more superconducting traces may be operable to transmit electrical current between quantum circuit elements on the first surface 406. The one or more superconducting traces may also be operable to transmit electrical current between a quantum circuit element on the first surface 406 and an electrical structure (e.g., a bond pad, an electrical pad, a solder ball, etc.) on a second surface 434 of the substrate 402. As such, the method 400 is capable of fabricating quantum circuits capable of routing superconducting electrical signals through the substrate 402.

Now referring back to FIGS. 2A-2C, in some implementations, the method 200 may produce a substrate having an etch-stop layer that covers the first surface 206 of the substrate 202. In these implementations, the etch-stop layer may effectively serve as part of the substrate 202. In some instances, the etch-stop layer is formed of an aluminum oxide material (i.e., $Al_xO_y$), such as sapphire. However, other materials are possible, such as hafnium oxide, fused silica, diamond, or multilayers comprising one or more materials.

Figure 5:
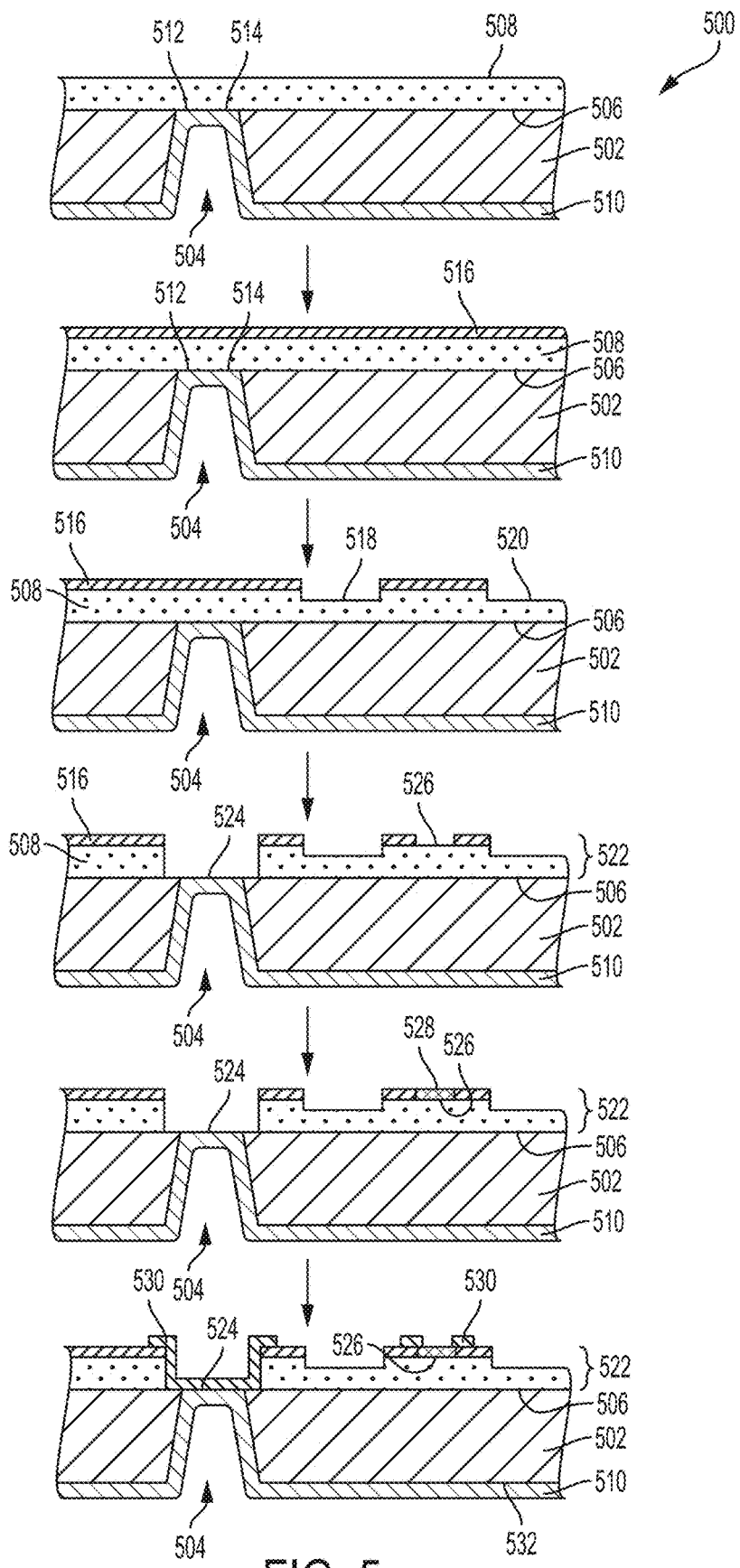
FIG. 5 is a schematic diagram of an example method for fabricating a quantum circuit on a substrate having a superconducting via and a first surface that is fully covered by an etch-stop layer.

FIG. 5 presents a schematic diagram of an example method 500 for fabricating a quantum circuit on a substrate 502 having a superconducting via 504 and a first surface 506 that is fully-covered by an etch-stop layer 508. The example method 500 may be downstream of the method 200 described in relation to FIGS. 2A-2C and may be part of an extended fabrication method. As such, other features or devices may be fabricated upon completion of the example method 500 (e.g., electrical pads, bond pads, etc.). The superconducting via 504 includes a layer 510 of superconducting material and may be formed by the method 200 described in relation to FIGS. 2A-2C. The layer 510 includes a first portion 512 having an exterior surface 514 that faces outward from the substrate 502. The first portion 512 defines a membrane structure of the superconducting via 504 that occludes a first orifice disposed on the first surface 506 of the substrate 502. The etch-stop layer 508 may cover the exterior surface 514, as shown by FIG. 5.

The method 500 includes depositing a first-side layer 516 of superconducting material over the etch-stop layer 508 (e.g., depositing a layer of niobium). The method 500 also includes selectively removing a portion of the first-side layer 516 and a portion of the etch-stop layer 508 to produce a void in one or both layers 508, 516. In some instances, such as shown in FIG. 5, the void may create a recessed surface within the etch stop layer 508. Reactive ion etching, laser milling, focused ion-beam milling, or another material removal process may be used to produce the void, and if applicable, the recessed surface. The void may define features of the quantum circuit not sensitive to mechanical damage or chemical contamination on (or proximate to) the first surface 506. Non-limiting examples of such features include a superconducting trace for carrying electrical current. In FIG. 5, the first-side layer 516 is depicted as having two recessed surfaces 518, 520. However, this depiction is not intended as limiting.

The method 500 additionally includes selectively removing a portion of the first-side layer 516 and a portion of the etch-stop layer 508 to produce a patterned multi-layer stack 522 on the substrate 502. Such selective removal may include an etching process, such as reactive ion etching. The patterned multi-layer stack 522 includes at least one of an exterior surface 524 of the superconducting via 504 and a surface 526 of the etch-stop layer 508. The surface 526 of the etch-stop layer 508 may be for fabricating a quantum circuit element (e.g., a Josephson junction). It will be appreciated that the surfaces 524, 526 have little or no mechanical damage or chemical contamination, making them desirable surfaces for fabricating sensitive components of the quantum circuit.

The method 500 further includes fabricating a quantum circuit element 528 on the surface 526 of the etch-stop layer 508. Fabricating the quantum circuit element 528 may involve a milling process to shape the quantum circuit element 528, e.g., laser milling, focused ion-beam milling, and so forth. However, in many implementations, a milling process is not used. The absence of the milling process may reduce or eliminate mechanical damage or chemical contamination on the first surface 506, on a surface of the patterned multi-layer stack 520, or both.

The method 500 still further includes depositing an overlayer of superconducting material over the patterned multilayer stack 520 and then selectively removing a portion of the overlayer to produce a patterned overlayer 530 of superconducting material. Such selective removal may include a milling process, e.g., laser milling, focused ion-beam milling, and so forth. The patterned overlayer 530 may serve to electrically couple the quantum circuit element 528 to the patterned first-side layer 516 (e.g., via a connecting trace defined by the patterned first-side layer 516), such as through a "bandage" process. The "bandage" process described above may be used in some cases.

The method 500 may be used to fabricate one or more quantum circuit elements (e.g., a Josephson junction, a resonator, a parametric amplifier, etc.) and one or more traces on the first surface 506 of the substrate 502 that define the quantum circuit (or a part thereof). The one or more superconducting traces may be operable to transmit electrical current between quantum circuit elements on the first surface 506. The one or more superconducting traces may also be operable to transmit electrical current between a quantum circuit element on the first surface 506 and an electrical structure (e.g., a bond pad, an electrical pad, a solder ball, etc.) on a second surface 532 of the substrate 502. As such, the method 500 is capable of fabricating quantum circuits capable of routing electrical signals through the substrate 502.

It will be understood that the extended fabrication method incorporating the methods described in relation to FIGS. 2A-2C, 3, 4, and 5 may include a method for fabricating features on a second surface of the substrate, i.e., a back- or interposer-side surface. If the features require minimal or no patterning, a blanket deposition of a layer over the second surface will suffice, either alone or through a shadow mask. The layer may be formed of any material necessary for the desired features, such as a metallic material, a superconducting layer, an insulating or dielectric material, a support material, and so forth. The layer may also be a multi-layer stack of such materials. In many instances, the layer is formed of superconducting material. The layer may optionally include a support material disposed over the superconducting material and opposite the second surface of the substrate.

Dry photoresists, self-leveling photoresists, or other lithographic materials and techniques may be used to pattern the layer by tenting over any superconducting vias exposed on the second surface (or otherwise protecting the superconducting vias). These photoresists and lithographic materials can allow exposure of unwanted material to removal processes, such as a reactive ion etch. The removal processes may remove one or both of the superconducting material and the optional support material from the second surface. Such removal may occur selectively to produce a patterned layer on the second surface. Removal of the superconducting material and removal of the optional support material may occur in separate steps.

Underbump metallization may be performed to enhance compatibility with flip-chip or other 3D integration processes (e.g., a multi-layer stack of titanium and platinum). Underbump metallization may be performed using a multitude of techniques including, but not limited to, tenting a superconducting via with dry photoresist and then performing a liftoff process in selected areas exposed to electromagnetic radiation (e.g., ultraviolet radiation). The liftoff process may use a develop solution to dissolve away dry photoresist from those selected areas. Other types of subtractive processes are also possible for removing portions of the dry photoresist (i.e., chemical etches, milling, etc.). For a superconducting via having a smaller-diameter orifice on the second surface, a flowable photoresist may be used to tent over the superconducting via. The flowable photoresist has a viscosity high enough to cover the small-diameter orifice without non-planar deformity or collapse. (The aforementioned dry photoresist is an extreme variant of a "high viscosity" photoresist.). Alternately, the underbump metallization itself may be used for an underbump (e.g., palladium may be included in a multi-layer metallization stack that is patterned and used as the underbump metallization).

"Bumps" of indium or other materials compatible with 3D integration (e.g. solder balls) may be disposed on the metallization for compatibility with downstream flip-chip or waferbond techniques. Wire-bonding may be made directly to the via metal or to patterned via metal. Niobium and alloys of molybdenum and rhenium, for instance, are both known to be compatible with conventional wirebonding techniques.

Patterning of the second surface of the substrate to form electrical connections to the superconducting vias allows superconducting "hop-overs" to be created. These "hop-overs" allow two electrical signals to cross each other, one on the first surface of the substrate (i.e., a device-side surface) and the other on the second surface of the substrate (i.e., "under" on an interposer-side surface).

In a general aspect, a superconducting via is configured to route electrical signals through a substrate.

In a first example, a superconducting via for routing electrical signals through a substrate includes the substrate and a layer formed of superconducting material. The substrate has a first orifice disposed on a first surface and a second orifice disposed on a second surface. A cavity extends from the first orifice to the second orifice. The layer of superconducting material includes a first portion occluding the first orifice and having an exterior surface facing outward from the substrate. The layer also includes a second portion in contact with a side wall of the cavity an extending to the second orifice. A quantum circuit element may optionally be disposed on the first surface and electrically coupled to the exterior surface of the first portion of the layer.

In some variations of the first example, the layer includes a third portion covering an area of the second surface and in contact therewith. In some variations of the first example, the cavity tapers progressively along a direction from the second orifice to the first orifice. In some variations of the first example, the via includes a quantum circuit element disposed on the first surface and electrically coupled to the exterior surface of the first portion of the layer. In some variations of the first example, the superconducting material has a superconducting critical temperature equal to or less than 40 K. In some variations of the first example, a support material is disposed over the layer and formed of a polymeric material or a metallic material.

Implementations of the first example may also include one or more of the following features. In one implementation, the layer includes a first layer formed of a first superconducting material and a second layer formed of a second superconducting material. The first layer is in contact with the side wall of the cavity and includes the exterior surface. The second layer is disposed over the first layer. A support material may optionally be disposed over the second layer that is formed of a polymeric material or a metallic material. In another implementation, the layer includes a first layer formed of a first superconducting material, a second layer formed of a second superconducting material, and a third layer formed of a third superconducting material. The first layer is in contact with the side wall of the cavity and comprises the exterior surface. The second layer is disposed over the first layer, and the third layer is disposed over the second layer. A support material may optionally be disposed over the third layer that is formed of a polymeric material or a metallic material.

In a second example, an integrated quantum circuit includes a silicon substrate and a layer formed of superconducting material. The silicon substrate has a first orifice disposed on a first planar surface and a second orifice disposed on a second planar surface. The first planar surface is disposed opposite the second planar surface and parallel thereto. A cavity extends from the first orifice to the second orifice along a longitudinal axis perpendicular to the first and second planar surfaces. The layer of superconducting material includes a first portion occluding the first orifice and having an exterior surface facing outward from the substrate. The layer also includes a second portion in contact with a side wall of the cavity an extending to the second orifice. A quantum circuit element may optionally be disposed on the first surface and electrically coupled to the exterior surface of the first portion of the layer.

In some variations of the second example, the superconducting material is titanium nitride. In some variations of the second example, the superconducting material is a niobium titanium nitride tertiary alloy (NbTiN). In some variations of the second example, the quantum integrated circuit includes a polyimide material disposed over the layer of superconducting material.

Implementations of the second example may also include one or more of the following features. In one implementation, the layer includes a first layer formed of niobium and a second layer formed of an alloy of molybdenum and rhenium. The first layer is in contact with the side wall of the cavity and includes the exterior surface. The second layer is disposed over the first layer. A polyimide material may optionally be disposed over the second layer. In another implementation, the layer includes a first layer formed of an alloy of molybdenum and rhenium, a second layer formed of niobium, and a third layer formed of an alloy of molybdenum and rhenium. The first layer is in contact with the side wall of the cavity and comprises the exterior surface. The second layer is disposed over the first layer, and the third layer is disposed over the second layer. A polyimide material may optionally be disposed over the third layer.

In another general aspect, a method is used to fabricate a superconducting via configured to route electrical signals through a substrate.

In a first example, the method includes depositing an etch-stop layer onto a first surface of the substrate. The method also includes etching a cavity through the substrate to the etch-stop layer, the cavity extending from a second surface of the substrate to an interior surface of the etch-stop layer. The method additionally includes depositing a layer of superconducting material onto the interior surface of the etch-stop layer and a side wall of the cavity. In some instances, depositing the layer of superconducting material includes depositing the layer of superconducting material onto an area of the second surface.

In some variations of the first example, the cavity tapers progressively from the second surface to the etch-stop layer. In further variations of the first example, the first surface and the second surface are planar surfaces parallel to each other and the cavity extends through the substrate along a longitudinal axis perpendicular to the first and second surfaces.

In some variations of the first example, the method includes removing the etch-stop layer from the first surface of the substrate, thereby exposing an exterior surface of the layer of superconducting material. In some variations of the first example, the method includes depositing a support material over the layer of superconducting material. The support material is formed of a polymeric material or an inorganic material. Depositing the layer of superconducting material may include depositing the layer of superconducting material onto an area of the second surface; and the method may include selectively removing one or more portions of the support material to expose at least a portion of the layer of superconducting material on the area of the second surface. The method may further include selectively removing one or more portions of the superconducting material to expose at least a portion of the area of the second surface.

Implementations of the first example may also include one or more of the following features. In some implementations, the method includes selectively removing one or more portions of the etch-stop layer to produce a patterned etch-stop layer on the first surface of the substrate.

In some implementations, the method includes depositing a first layer of superconducting material onto the interior surface of the etch-stop layer and the side wall of the cavity and depositing a second layer of second superconducting material over the first layer of superconducting material. In these implementations, the method may optionally include depositing a support material over the second layer of superconducting material. The support material is formed of a polymeric material or a metallic material.

In some implementations, the method includes depositing a first layer of superconducting material onto the interior surface of the etch-stop layer and the side wall of the cavity. The method also includes depositing a second layer of superconducting material over the first layer of superconducting material. The method additionally includes depositing a third layer of superconducting material over the second layer of superconducting material. In these implementations, the method may optionally include depositing a support material over the third layer of superconducting material. The support material is formed of a polymeric material or a metallic material.

Figure 6A:
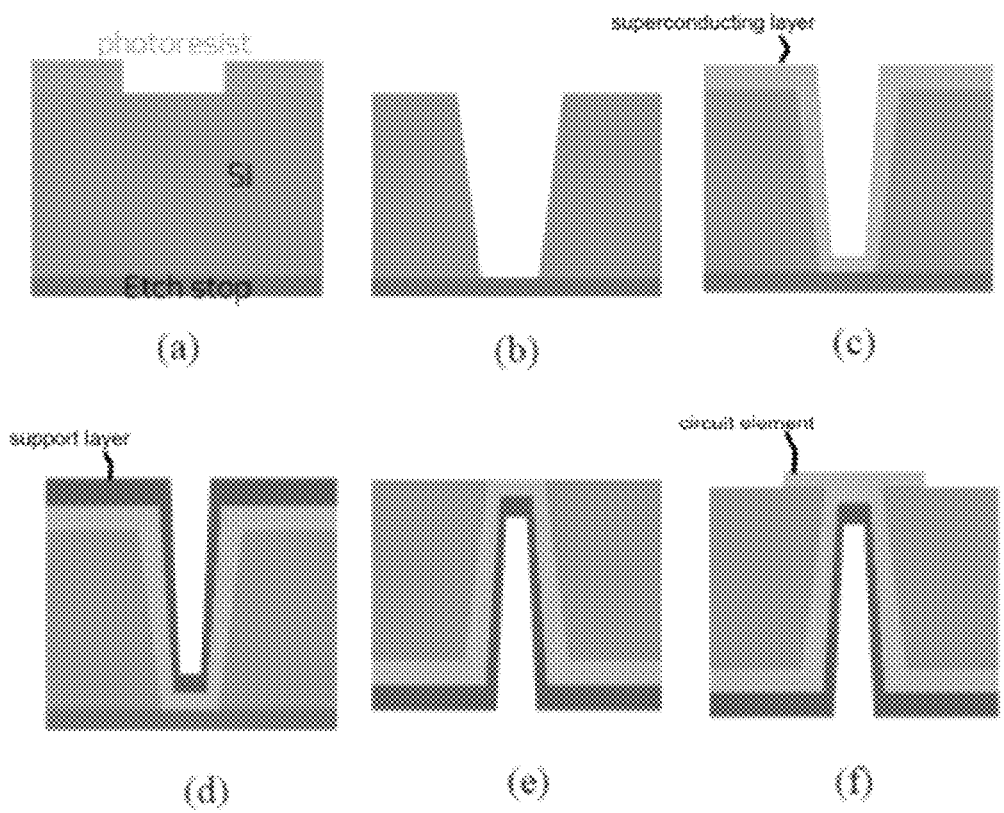
FIGS. 6A-6B illustrate an example process for forming vias in a substrate.
Figure 6B:
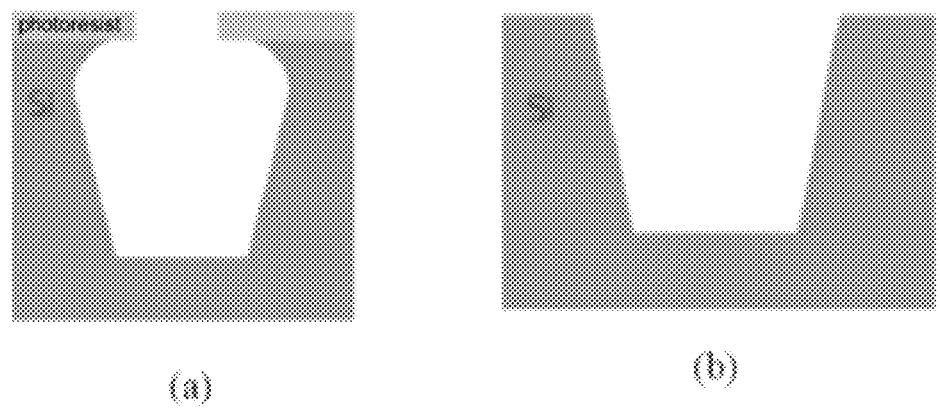

FIGS. 6A-6B illustrate an example process for forming vias in a substrate. The processes of FIGS. 6A-6B may be used to form the vias described above. For example, the processes of FIGS. 6A-6B may be used to form electrically conducting vias or signal vias. In some instances, one or more material choices, etching parameters, layer thicknesses, or other aspects may be used with the processes of FIGS. 6A-6B to form vias in a substrate.

The process begins at step (a) in FIG. 6A, where a film is deposited on one side of the substrate and a photoresist pattern is deposited on the opposite side. The film is highly selective to the etchant used for forming the vias (so that the film acts as an etch stop). Because of the inclusion of this film, the need for chemical mechanical polishing to reveal the vias at the end of the fabrication process may be avoided. Instead, the film may be etched away at the end of the process to reveal the vias. At step (b), The via walls are formed from the side of the wafer opposite the etch stop layer. For example, an etching process may be used to form vias below holes in the photoresist pattern. The vias may be formed such that they have a sidewall taper angle (with respect to the normal of a bonding surface of the cap wafer or circuit wafer) between 10-25 degrees, such as, for example, between 12-20 degrees or between 14-17 degrees. In some implementations, the vias are formed with a two-step etching process that includes a plasma etching process step (e.g., using $SF_6/O_2/Ar$ gases) and a global isotropic etching process step. An example two-step process is shown in FIG. 6B. In some implementations, the plasma etching process is performed using a non-Bosch process in an SPTS inductively coupled plasma (ICP) tool. The step (a) shown in FIG. 6B illustrates an example result of the plasma etching process step, where the angled sidewalls are formed but an overhang region remains near the top of the via cavity. To remove the photoresist and overhang region, a global isotropic etch is then applied, and an example result of the global isotropic etch is illustrated in step (b) of FIG. 6B. In some instances, the global isotropic etch process removes approximately 50 micrometers (μm) of thickness from the substrate. In some implementations, the via formation process is achieved with flows of between 40-180 standard cubic centimeters per minute (sccm) and 40-100 sccm for $SF_6/O_2$ during the plasma etching process, and flows between 150-350 sccm and 15-100 sccm for $SF_6/O_2$ of the global isotropic etching process (e.g., 135/70 sccm, respectively and 300/75 sccm for the plasma and global isotropic etching processes, respectively).

At step (c), a layer of superconducting metal (e.g., aluminum) is deposited in the vias. The superconducting metal layer may cover the sidewalls and the bottom of the vias as shown. The superconducting metal may be deposited, in some instances, using an electron-beam evaporation technique. At step (d), a support layer (e.g., parylene) is deposited on top of the superconducting metal layer. The support layer may be deposited, in some instances, using an etching process) to reveal the superconducting metal layer on the other side of the substrate. At step (e), the etch stop layer is removed. At step (f), one or more circuit elements are formed or deposited on the side of the substrate where the etch stop was deposited. The circuit elements may conductively couple to the superconducting metal layer deposited in the via, such that circuit elements on one side of the substrate may be in communication with circuit elements on the opposite side of the substrate.

In some implementations, the superconducting metal deposited in the vias includes aluminum, molybdenum, titanium, niobium, ruthenium, rhenium, tantalum, vanadium, zirconium, an alloy or compound of superconducting metals (e.g., molybdenum/rhenium, titanium nitride, niobium nitride, or titanium niobium nitride), or another type of superconducting metal, alloy, or compound. Furthermore, in some instances, multiple layers of superconducting metals may be deposited in the vias, which may enhance the handling by the wafer of stress and adhesion during a fabrication process. For example, a multi-layer superconducting metal stack in the vias may include at least two layers of aluminum, molybdenum, titanium, niobium, ruthenium, rhenium, tantalum, vanadium, zirconium, an alloy or compound of superconducting metals (e.g., molybdenum/rhenium, titanium nitride, niobium nitride, or titanium niobium nitride), or another type of superconducting metal, alloy, or compound. In some instances, the metal or multi-layer metal stack in the via has a thickness between approximately 100 nanometers (nm) and one (1) micrometer (μm), such as, for example approximately 200 nanometers (nm) or approximately 500 nanometers (nm). In some implementations, the superconducting metal is deposited using an atomic layer deposition (ALD) technique. Once deposited, the superconducting metal or multi-layer metal stack may have one or more superconducting properties, such as, for example, zero (0) resistance or near-zero resistance (e.g., less than one (1) milliohm (mΩ)).

In some implementations, the support layer deposited on the superconducting layer inside the vias includes a polymer material, such as, for example, parylene, polyimide, benzocyclobutene (BCB), spin-on glass, or another type of polymer material. The polymer material may be a high temperature cure polymer in some instances. The polymer material may be deposited using spin on physical vapor deposition (PVD) techniques. In some implementations, the support layer includes an electroplated metal, such as, for example copper, tin, or indium. The support layer may have a thickness between approximately 10-30 micrometers (μm), such as, for example, approximately 20 micrometers (μm). In some implementations, the support layer material may be chosen because it may be cryogenically cycled many times without degradation. For example, the support layer may be able to be cycled over twenty (20) times between cryogenic and non-cryogenic (e.g., room temperature) temperatures using liquid nitrogen.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described above should not be understood as requiring such separation in all implementations, and it should be understood that the described components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A superconducting via for routing electrical signals through a substrate, the via comprising:
the substrate, having a first surface and a second surface and comprising:
a first orifice disposed on the first surface,
a second orifice disposed on the second surface, and
a cavity extending from the first orifice to the second orifice, wherein the cavity is defined by non-parallel side walls that taper progressively along a direction from the second orifice to the first orifice, and the second orifice is larger than the first orifice;
a layer formed of superconducting material, the layer comprising:
a first portion occluding the first orifice and having an exterior surface facing outward from the substrate, and a second portion in contact with the side walls of the cavity and extending to the second orifice; and a support material formed of a polymeric material and configured to mechanically support the first portion of the layer from inside the cavity, the support material disposed on the layer within the cavity on a surface of the first portion opposite the exterior surface and on a surface of the second portion opposite the side walls of the cavity.

2. The via of claim 1, comprising a quantum circuit element disposed on the first surface and electrically coupled to the exterior surface of the first portion of the layer.

3. The via of claim 1, wherein the superconducting material has a superconducting critical temperature equal to or less than 40 K.

4. The via of claim 1,
wherein the layer comprises a first layer formed of a first superconducting material and a second layer formed of a second superconducting material;
wherein the first layer is in contact with the side wall of the cavity and comprises the exterior surface; and
wherein the second layer is disposed over the first layer.

5. The via of claim 1,
wherein the layer comprises a first layer formed of a first superconducting material, a second layer formed of a second superconducting material, and a third layer formed of a third superconducting material;
wherein the first layer is in contact with the side wall of the cavity and comprises the exterior surface;
wherein the second layer is disposed over the first layer; and
wherein the third layer is disposed over the second layer.

6. The via of claim 5, wherein the support material is disposed over the third layer.

7. The via of claim 1,
wherein the layer comprises first and second layers, the first layer in contact with the side wall of the cavity and comprising the exterior surface, the second layer disposed over the first layer;
wherein the first and second layers are formed of, respectively, first and second superconducting materials having different compositions; and
wherein the first and second superconducting materials comprise aluminum, molybdenum, titanium, niobium, ruthenium, rhenium, tantalum, vanadium, zirconium, or any combination thereof.

8. The via of claim 1, wherein the layer further comprises:
a third portion covering an area of the second surface and in contact therewith.

9. The via of claim 1, wherein the polymeric material comprises one of parylene, polyimide, benzocyclobutene (BCB), or spin-on glass.

10. The via of claim 1, wherein the support material is disposed on the surfaces of the first and second portions of the layer as a conformal layer.

11. An integrated quantum circuit, comprising:
a silicon substrate having a first planar surface disposed opposite a second planar surface and parallel thereto, the silicon substrate comprising:
a first orifice disposed on the first planar surface,
a second orifice disposed on the second planar surface,
a cavity extending from the first orifice to the second orifice along a longitudinal axis perpendicular to the first and second planar surfaces, wherein the cavity is defined by non-parallel side walls that taper progressively along a direction from the second orifice to the first orifice, and the second orifice is larger than the first orifice;
a layer formed of superconducting material, the layer comprising:
a first portion occluding the first orifice and having an exterior surface facing outward from the substrate, and
a second portion in contact with the side walls of the cavity and extending to the second orifice;
a support material formed of a polymer material and configured to mechanically support the first portion of the layer from inside the cavity, the support material disposed on the layer within the cavity on a surface of the first portion opposite the exterior surface and on a surface of the second portion opposite the side walls of the cavity; and
a quantum circuit element disposed on the first surface and comprising a Josephson junction, the quantum circuit element electrically coupled to the exterior surface of the first portion of the layer.

12. The integrated quantum circuit of claim 11, wherein the superconducting material of the layer is titanium nitride.

13. The integrated quantum circuit of claim 11, wherein the superconducting material of the layer is a niobium titanium nitride tertiary alloy.

14. The integrated quantum circuit of claim 11,
wherein the layer comprises a first layer formed of niobium and a second layer formed of an alloy of molybdenum and rhenium;
wherein the first layer is in contact with the side wall of the cavity and comprises the exterior surface;
wherein the second layer is disposed over the first layer; and
wherein the support material is disposed over the second layer.

15. The integrated quantum circuit of claim 11,
wherein the layer comprises a first layer formed of an alloy of molybdenum and rhenium, a second layer formed of niobium, and a third layer formed of the alloy of molybdenum and rhenium;
wherein the first layer is in contact with the side wall of the cavity and comprises the exterior surface;
wherein the second layer is disposed over the first layer;
wherein the third layer is disposed over the second layer; and
wherein the support material is disposed over the third layer.

16. The integrated quantum circuit of claim 11,
wherein the layer comprises first and second layers, the first layer in contact with the side wall of the cavity and comprising the exterior surface, the second layer disposed over the first layer;
wherein the first and second layers are formed of, respectively, first and second superconducting materials having different compositions; and
wherein the first and second superconducting materials comprise aluminum, molybdenum, titanium, niobium, ruthenium, rhenium, tantalum, vanadium, zirconium, or any combination thereof.

17. The integrated quantum circuit of claim 11, wherein the layer further comprises:
a third portion covering an area of the second surface and in contact therewith.

18. The integrated quantum circuit of claim 11, wherein the polymeric material comprises one of parylene, polyimide, benzocyclobutene (BCB), or spin-on glass.

19. The integrated quantum circuit of claim 11, wherein the support material is disposed on the surfaces of the first and second portions of the layer as a conformal layer.

\* \* \* \* \*